United States Patent
Badaruzzaman et al.

(10) Patent No.: US 9,246,223 B2
(45) Date of Patent: Jan. 26, 2016

(54) ANTENNA TUNING FOR MULTIBAND OPERATION

(75) Inventors: Firass Mirza Badaruzzaman, Forest Park, IL (US); Randy Alan Wiessner, Palatine, IL (US); Marshall Joseph Katz, Palatine, IL (US)

(73) Assignee: BLACKBERRY LIMITED, Waterloo, Ontario (CA)

( * ) Notice: Subject to any disclaimer, the term of this patent is extended or adjusted under 35 U.S.C. 154(b) by 523 days.

(21) Appl. No.: 13/551,248

(22) Filed: Jul. 17, 2012

(65) Prior Publication Data

US 2014/0022132 A1 Jan. 23, 2014

(51) Int. Cl.
H01Q 9/00 (2006.01)
H01Q 9/14 (2006.01)
H01Q 9/04 (2006.01)
H03H 7/40 (2006.01)
H01Q 5/371 (2015.01)

(52) U.S. Cl.
CPC .............. *H01Q 9/14* (2013.01); *H01Q 5/371* (2015.01); *H01Q 9/0421* (2013.01); *H03H 7/40* (2013.01)

(58) Field of Classification Search
CPC ..... H01Q 9/0421; H01Q 9/14; H01Q 5/0058; H03H 7/40
USPC .......................................... 343/745, 700 MS
See application file for complete search history.

(56) References Cited

U.S. PATENT DOCUMENTS

| | | | |
|---|---|---|---|
| 2,745,067 A | 5/1956 | True | |
| 3,117,279 A | 1/1964 | Ludvigson | |
| 3,160,832 A | 12/1964 | Beitman | |
| 3,390,337 A | 6/1968 | Beitman | |
| 3,443,231 A | 5/1969 | Roza | |
| 3,509,500 A | 4/1970 | McNair | |
| 3,571,716 A | 3/1971 | Hill | |

(Continued)

FOREIGN PATENT DOCUMENTS

| | | |
|---|---|---|
| CN | 101640949 A | 2/2010 |
| DE | 19614655 | 10/1997 |

(Continued)

OTHER PUBLICATIONS

Bezooijen, A. et al., "A GSM/EDGE/WCDMA Adaptive Series-LC Matching Network Using RF-MEMS Switches", IEEE Journal of Solid-State Circuits, vol. 43, No. 10, Oct. 2008, 2259-2268.

(Continued)

*Primary Examiner* — Sue A Purvis
*Assistant Examiner* — Jae Kim
(74) *Attorney, Agent, or Firm* — Guntin & Gust, PLC; Ralph Trementozzi

(57) ABSTRACT

A system and process that includes a multiband antenna as may be used in mobile communications devices. The multiband antenna includes a feed port coupled to each of a first radiating portion and a second radiating portion. Each of the first and second radiating portions defines a respective resonant bandwidth. The multiband antenna also includes at least one adjustable tuning circuit disposed between separate and displaced radiating segments of a respective one of the first and second radiating portions. Adjustment of the tuning circuit alters a corresponding resonant bandwidth allowing the corresponding resonant bandwidth to be tuned independently of the other resonant bandwidth and without affecting performance of the other resonant bandwidth. Other embodiments are disclosed.

13 Claims, 14 Drawing Sheets

(SECTION A-A')

(56) References Cited

U.S. PATENT DOCUMENTS

| | | |
|---|---|---|
| 3,590,385 A | 6/1971 | Sabo |
| 3,601,717 A | 8/1971 | Kuecken |
| 3,794,941 A | 2/1974 | Templin |
| 3,919,644 A | 11/1975 | Smolka |
| 3,990,024 A | 11/1976 | Hou |
| 3,995,237 A | 11/1976 | Brunner |
| 4,186,359 A | 1/1980 | Kaegebein |
| 4,201,960 A | 5/1980 | Skutta |
| 4,227,256 A | 10/1980 | O'Keefe |
| 4,383,441 A | 5/1983 | Willis |
| 4,476,578 A | 10/1984 | Gaudin |
| 4,493,112 A | 1/1985 | Bruene |
| 4,509,019 A | 4/1985 | Banu et al. |
| 4,777,490 A | 10/1988 | Sharma |
| 4,799,066 A | 1/1989 | Deacon |
| 4,965,607 A | 10/1990 | Wilkins |
| 4,980,656 A | 12/1990 | Duffalo |
| 5,032,805 A | 7/1991 | Elmer |
| 5,142,255 A | 8/1992 | Chang |
| 5,177,670 A | 1/1993 | Shinohara |
| 5,195,045 A | 3/1993 | Keane |
| 5,200,826 A | 4/1993 | Seong |
| 5,212,463 A | 5/1993 | Babbitt |
| 5,230,091 A | 7/1993 | Vaisanen et al. |
| 5,243,358 A | 9/1993 | Sanford |
| 5,258,728 A | 11/1993 | Taniyoshi |
| 5,276,912 A | 1/1994 | Siwiak |
| 5,301,358 A | 4/1994 | Gaskill |
| 5,307,033 A | 4/1994 | Koscica |
| 5,310,358 A | 5/1994 | Johnson |
| 5,312,790 A | 5/1994 | Sengupta |
| 5,334,958 A | 8/1994 | Babbitt |
| 5,361,403 A | 11/1994 | Dent |
| 5,371,473 A | 12/1994 | Trinh |
| 5,409,889 A | 4/1995 | Das |
| 5,427,988 A | 6/1995 | Sengupta |
| 5,430,417 A | 7/1995 | Martin |
| 5,446,447 A | 8/1995 | Carney |
| 5,448,252 A | 9/1995 | Ali |
| 5,451,567 A | 9/1995 | Das |
| 5,451,914 A | 9/1995 | Stengel |
| 5,457,394 A | 10/1995 | McEwan |
| 5,472,935 A | 12/1995 | Yandrofski |
| 5,479,139 A | 12/1995 | Koscica |
| 5,486,491 A | 1/1996 | Sengupta |
| 5,496,795 A | 3/1996 | Das |
| 5,502,372 A | 3/1996 | Quan |
| 5,524,281 A | 6/1996 | Bradley |
| 5,548,837 A | 8/1996 | Hess et al. |
| 5,561,407 A | 10/1996 | Koscica |
| 5,564,086 A | 10/1996 | Cygan |
| 5,589,844 A | 12/1996 | Belcher et al. |
| 5,593,495 A | 1/1997 | Masuda |
| 5,635,433 A | 6/1997 | Sengupta |
| 5,635,434 A | 6/1997 | Sengupta |
| 5,640,042 A | 6/1997 | Koscica |
| 5,679,624 A | 10/1997 | Das |
| 5,689,219 A | 11/1997 | Piirainen |
| 5,693,429 A | 12/1997 | Sengupta |
| 5,694,134 A | 12/1997 | Barnes |
| 5,699,071 A | 12/1997 | Urakami |
| 5,721,194 A | 2/1998 | Yandrofski |
| 5,766,697 A | 6/1998 | Sengupta et al. |
| 5,777,581 A | 7/1998 | Lilly |
| 5,778,308 A | 7/1998 | Sroka |
| 5,786,727 A | 7/1998 | Sigmon |
| 5,812,572 A | 9/1998 | King |
| 5,812,943 A | 9/1998 | Suzuki |
| 5,830,591 A | 11/1998 | Sengupta |
| 5,846,893 A | 12/1998 | Sengupta |
| 5,874,926 A | 2/1999 | Tsuru |
| 5,880,635 A | 3/1999 | Satoh |
| 5,886,867 A | 3/1999 | Chivukula |
| 5,892,482 A | 4/1999 | Coleman et al. |
| 5,929,717 A | 7/1999 | Richardson |
| 5,940,030 A | 8/1999 | Hampel et al. |
| 5,963,871 A | 10/1999 | Zhinong |
| 5,969,582 A | 10/1999 | Boesch |
| 5,982,099 A | 11/1999 | Barnes et al. |
| 5,990,766 A | 11/1999 | Zhang |
| 6,009,124 A | 12/1999 | Smith |
| 6,020,787 A | 2/2000 | Kim |
| 6,020,795 A | 2/2000 | Kim |
| 6,029,075 A | 2/2000 | Das |
| 6,045,932 A | 4/2000 | Jia |
| 6,061,025 A | 5/2000 | Jackson |
| 6,064,865 A | 5/2000 | Kuo et al. |
| 6,074,971 A | 6/2000 | Chiu |
| 6,096,127 A | 8/2000 | Dimos |
| 6,100,733 A | 8/2000 | Dortu |
| 6,101,102 A | 8/2000 | Brand |
| 6,115,585 A | 9/2000 | Matero |
| 6,125,266 A | 9/2000 | Matero et al. |
| 6,133,883 A | 10/2000 | Munson |
| 6,172,385 B1 | 1/2001 | Duncombe |
| 6,215,644 B1 | 4/2001 | Dhuler |
| 6,242,989 B1 | 6/2001 | Barber |
| 6,281,748 B1 | 8/2001 | Klomsdorf et al. |
| 6,281,847 B1 | 8/2001 | Lee |
| 6,343,208 B1 | 1/2002 | Ying |
| 6,377,142 B1 | 4/2002 | Chiu |
| 6,377,217 B1 | 4/2002 | Zhu |
| 6,377,440 B1 | 4/2002 | Zhu |
| 6,384,785 B1 | 5/2002 | Kamogawa |
| 6,404,614 B1 | 6/2002 | Zhu |
| 6,408,190 B1 | 6/2002 | Ying |
| 6,414,562 B1 | 7/2002 | Bouisse |
| 6,415,562 B1 | 7/2002 | Donaghue |
| 6,452,776 B1 | 9/2002 | Chakravorty |
| 6,461,930 B2 | 10/2002 | Akram |
| 6,466,774 B1 | 10/2002 | Okabe |
| 6,492,883 B2 | 12/2002 | Liang |
| 6,514,895 B1 | 2/2003 | Chiu |
| 6,525,630 B1 | 2/2003 | Zhu |
| 6,531,936 B1 | 3/2003 | Chiu |
| 6,535,076 B2 | 3/2003 | Partridge |
| 6,535,722 B1 | 3/2003 | Rosen |
| 6,538,603 B1 | 3/2003 | Chen |
| 6,556,102 B1 | 4/2003 | Sengupta |
| 6,556,814 B1 | 4/2003 | Klomsdorf |
| 6,570,462 B2 | 5/2003 | Edmonson |
| 6,590,468 B2 | 7/2003 | du Toit |
| 6,590,541 B1 | 7/2003 | Schultze |
| 6,597,265 B2 | 7/2003 | Liang |
| 6,608,603 B2 | 8/2003 | Alexopoulos |
| 6,624,786 B2 | 9/2003 | Boyle |
| 6,640,085 B1 | 10/2003 | Chatzipetros |
| 6,657,595 B1 | 12/2003 | Phillips et al. |
| 6,661,638 B2 | 12/2003 | Jackson et al. |
| 6,670,256 B2 | 12/2003 | Yang |
| 6,710,651 B2 | 3/2004 | Forrester |
| 6,724,611 B1 | 4/2004 | Mosley |
| 6,724,890 B1 | 4/2004 | Bareis |
| 6,737,179 B2 | 5/2004 | Sengupta |
| 6,747,522 B2 | 6/2004 | Pietruszynski et al. |
| 6,759,918 B2 | 7/2004 | Du Toit et al. |
| 6,765,540 B2 | 7/2004 | Toncich |
| 6,768,472 B2 | 7/2004 | Alexopoulos |
| 6,774,077 B2 | 8/2004 | Sengupta |
| 6,795,712 B1 | 9/2004 | Vakilian |
| 6,825,818 B2 | 11/2004 | Toncich |
| 6,839,028 B2 | 1/2005 | Lee |
| 6,845,126 B2 | 1/2005 | Dent |
| 6,859,104 B2 | 2/2005 | Toncich |
| 6,862,432 B1 | 3/2005 | Kim |
| 6,864,757 B2 | 3/2005 | Du Toit |
| 6,868,260 B2 | 3/2005 | Jagielski |
| 6,882,245 B2 | 4/2005 | Utsunomiya |
| 6,888,714 B2 | 5/2005 | Shaw |
| 6,905,989 B2 | 6/2005 | Ellis |
| 6,906,653 B2 | 6/2005 | Uno |
| 6,907,234 B2 | 6/2005 | Karr |
| 6,920,315 B1 | 7/2005 | Wilcox et al. |
| 6,943,078 B1 | 9/2005 | Zheng |

(56) References Cited

U.S. PATENT DOCUMENTS

| | | |
|---|---|---|
| 6,946,847 B2 | 9/2005 | Nishimori |
| 6,949,442 B2 | 9/2005 | Barth |
| 6,961,368 B2 | 11/2005 | Dent |
| 6,964,296 B2 | 11/2005 | Memory |
| 6,965,837 B2 | 11/2005 | Vintola |
| 6,987,493 B2 | 1/2006 | Chen |
| 6,993,297 B2 | 1/2006 | Smith |
| 7,009,455 B2 | 3/2006 | Toncich |
| 7,071,776 B2 | 7/2006 | Forrester |
| 7,106,715 B1 | 9/2006 | Kelton |
| 7,107,033 B2 | 9/2006 | du Toit |
| 7,113,614 B2 | 9/2006 | Rhoads |
| 7,151,411 B2 | 12/2006 | Martin |
| 7,176,634 B2 | 2/2007 | Kitamura |
| 7,176,845 B2 | 2/2007 | Fabrega-Sanchez |
| 7,180,467 B2 | 2/2007 | Fabrega-Sanchez |
| 7,221,327 B2 | 5/2007 | Toncich |
| 7,298,329 B2 | 11/2007 | Diament |
| 7,299,018 B2 | 11/2007 | Van Rumpt |
| 7,312,118 B2 | 12/2007 | Kiyotoshi |
| 7,332,980 B2 | 2/2008 | Zhu |
| 7,332,981 B2 | 2/2008 | Matsuno |
| 7,339,527 B2 | 3/2008 | Sager |
| 7,426,373 B2 | 9/2008 | Clingman |
| 7,427,949 B2 | 9/2008 | Channabasappa et al. |
| 7,453,405 B2 | 11/2008 | Nishikido et al. |
| 7,468,638 B1 | 12/2008 | Tsai |
| 7,469,129 B2 | 12/2008 | Blaker et al. |
| 7,528,674 B2 | 5/2009 | Kato et al. |
| 7,535,080 B2 | 5/2009 | Zeng et al. |
| 7,535,312 B2 | 5/2009 | McKinzie |
| 7,539,527 B2 | 5/2009 | Jang |
| 7,596,357 B2 | 9/2009 | Nakamata |
| 7,633,355 B2 | 12/2009 | Matsuo |
| 7,642,879 B2 | 1/2010 | Matsuno |
| 7,667,663 B2 | 2/2010 | Hsiao |
| 7,671,693 B2 | 3/2010 | Brobston et al. |
| 7,705,692 B2 | 4/2010 | Fukamachi et al. |
| 7,711,337 B2 | 5/2010 | McKinzie |
| 7,714,676 B2 | 5/2010 | McKinzie |
| 7,714,678 B2 | 5/2010 | du Toit et al. |
| 7,728,693 B2 | 6/2010 | du Toit et al. |
| 7,760,699 B1 | 7/2010 | Malik |
| 7,768,400 B2 | 8/2010 | Lawrence et al. |
| 7,786,819 B2 | 8/2010 | Ella |
| 7,795,990 B2 | 9/2010 | du Toit |
| 7,852,170 B2 | 12/2010 | McKinzie |
| 7,856,228 B2 | 12/2010 | Lekutai et al. |
| 7,865,154 B2 | 1/2011 | Mendolia |
| 7,907,094 B2 | 3/2011 | Kakitsu et al. |
| 7,917,104 B2 | 3/2011 | Manssen et al. |
| 7,949,309 B2 | 5/2011 | Rofougaran |
| 7,969,257 B2 | 6/2011 | du Toit |
| 7,983,615 B2 | 7/2011 | Bryce et al. |
| 7,991,363 B2 | 8/2011 | Greene |
| 8,112,043 B2 | 2/2012 | Knudsen et al. |
| 8,170,510 B2 | 5/2012 | Knudsen et al. |
| 8,190,109 B2 | 5/2012 | Ali et al. |
| 8,204,446 B2 | 6/2012 | Scheer |
| 8,217,731 B2 | 7/2012 | McKinzie et al. |
| 8,217,732 B2 | 7/2012 | McKinzie |
| 8,299,867 B2 | 10/2012 | McKinzie |
| 8,320,850 B1 | 11/2012 | Khlat |
| 8,325,097 B2 | 12/2012 | McKinzie, III et al. |
| 8,405,563 B2 | 3/2013 | McKinzie et al. |
| 8,421,548 B2 | 4/2013 | Spears et al. |
| 8,432,234 B2 | 4/2013 | Manssen et al. |
| 8,442,457 B2 | 5/2013 | Harel et al. |
| 8,457,569 B2 | 6/2013 | Blin |
| 8,472,888 B2 | 6/2013 | Manssen et al. |
| 8,543,176 B1 | 9/2013 | Daniel et al. |
| 8,558,633 B2 | 10/2013 | McKinzie, III |
| 8,564,381 B2 | 10/2013 | McKinzie |
| 8,594,584 B2 | 11/2013 | Greene et al. |
| 8,620,236 B2 | 12/2013 | Manssen et al. |
| 8,620,246 B2 | 12/2013 | McKinzie et al. |
| 8,620,247 B2 | 12/2013 | McKinzie et al. |
| 8,655,286 B2 | 2/2014 | Mendolia |
| 8,674,783 B2 | 3/2014 | Spears et al. |
| 8,680,934 B2 | 3/2014 | McKinzie et al. |
| 8,693,963 B2 | 4/2014 | du Toit et al. |
| 8,712,340 B2 | 4/2014 | Hoirup et al. |
| 8,787,845 B2 | 7/2014 | Manssen et al. |
| 2002/0008672 A1 | 1/2002 | Gothard et al. |
| 2002/0030566 A1 | 3/2002 | Bozler |
| 2002/0079982 A1 | 6/2002 | Lafleur et al. |
| 2002/0109642 A1 | 8/2002 | Gee et al. |
| 2002/0118075 A1 | 8/2002 | Ohwada |
| 2002/0145483 A1 | 10/2002 | Bouisse |
| 2002/0167963 A1 | 11/2002 | Joa-Ng |
| 2002/0183013 A1 | 12/2002 | Auckland et al. |
| 2002/0187780 A1 | 12/2002 | Souissi |
| 2002/0191703 A1 | 12/2002 | Ling et al. |
| 2002/0193088 A1 | 12/2002 | Jung |
| 2003/0060227 A1 | 3/2003 | Sekine |
| 2003/0071300 A1 | 4/2003 | Yashima |
| 2003/0114124 A1 | 6/2003 | Higuchi |
| 2003/0142022 A1 | 7/2003 | Ollikainen |
| 2003/0193997 A1 | 10/2003 | Dent |
| 2003/0199286 A1 | 10/2003 | du Toit |
| 2003/0210206 A1 | 11/2003 | Phillips |
| 2003/0216150 A1 | 11/2003 | Ueda |
| 2003/0232607 A1 | 12/2003 | Le Bars |
| 2004/0009754 A1 | 1/2004 | Smith, Jr. et al. |
| 2004/0090372 A1 | 5/2004 | Nallo |
| 2004/0100341 A1 | 5/2004 | Luetzelschwab |
| 2004/0127178 A1 | 7/2004 | Kuffner |
| 2004/0137950 A1 | 7/2004 | Bolin |
| 2004/0202399 A1 | 10/2004 | Kochergin |
| 2004/0227176 A1 | 11/2004 | York |
| 2004/0232982 A1 | 11/2004 | Ichitsubo et al. |
| 2004/0257293 A1 | 12/2004 | Friedrich et al. |
| 2004/0263411 A1 | 12/2004 | Fabrega-Sanchez et al. |
| 2005/0007291 A1 | 1/2005 | Fabrega-Sanchez |
| 2005/0032488 A1 | 2/2005 | Pehlke |
| 2005/0032541 A1 | 2/2005 | Wang |
| 2005/0042994 A1 | 2/2005 | Otaka |
| 2005/0059362 A1 | 3/2005 | Kalajo |
| 2005/0082636 A1 | 4/2005 | Yashima |
| 2005/0085204 A1 | 4/2005 | Poilasne et al. |
| 2005/0093624 A1 | 5/2005 | Forrester et al. |
| 2005/0130608 A1 | 6/2005 | Forse |
| 2005/0130699 A1 | 6/2005 | Kim |
| 2005/0208960 A1 | 9/2005 | Hassan |
| 2005/0215204 A1 | 9/2005 | Wallace |
| 2005/0227633 A1 | 10/2005 | Dunko |
| 2005/0259011 A1 | 11/2005 | Vance |
| 2005/0264455 A1 | 12/2005 | Talvitie |
| 2005/0282503 A1 | 12/2005 | Onno |
| 2006/0003537 A1 | 1/2006 | Sinha |
| 2006/0009165 A1 | 1/2006 | Alles |
| 2006/0077082 A1 | 4/2006 | Shanks et al. |
| 2006/0099915 A1 | 5/2006 | Laroia et al. |
| 2006/0119511 A1 | 6/2006 | Collinson et al. |
| 2006/0148415 A1 | 7/2006 | Hamalainen et al. |
| 2006/0160501 A1 | 7/2006 | Mendolia |
| 2006/0183431 A1 | 8/2006 | Chang et al. |
| 2006/0183433 A1 | 8/2006 | Mori et al. |
| 2006/0183442 A1 | 8/2006 | Chang et al. |
| 2006/0195161 A1 | 8/2006 | Li et al. |
| 2006/0205368 A1 | 9/2006 | Bustamante |
| 2006/0281423 A1 | 12/2006 | Caimi et al. |
| 2007/0013483 A1 | 1/2007 | Stewart |
| 2007/0035458 A1 | 2/2007 | Ohba |
| 2007/0042725 A1 | 2/2007 | Poilasne |
| 2007/0042734 A1 | 2/2007 | Ryu |
| 2007/0063788 A1 | 3/2007 | Zhu |
| 2007/0077956 A1 | 4/2007 | Julian et al. |
| 2007/0080888 A1 | 4/2007 | Mohamadi |
| 2007/0082611 A1 | 4/2007 | Terranova et al. |
| 2007/0085609 A1 | 4/2007 | Itkin |
| 2007/0091006 A1 | 4/2007 | Thober et al. |
| 2007/0111681 A1 | 5/2007 | Alberth et al. |
| 2007/0142011 A1 | 6/2007 | Shatara |

(56) References Cited

U.S. PATENT DOCUMENTS

| | | |
|---|---|---|
| 2007/0142014 A1 | 6/2007 | Wilcox |
| 2007/0149146 A1 | 6/2007 | Hwang |
| 2007/0171879 A1 | 7/2007 | Bourque |
| 2007/0182636 A1 | 8/2007 | Carlson |
| 2007/0184825 A1 | 8/2007 | Lim et al. |
| 2007/0194859 A1 | 8/2007 | Brobston |
| 2007/0197180 A1 | 8/2007 | McKinzie et al. |
| 2007/0200766 A1 | 8/2007 | McKinzie |
| 2007/0200773 A1 | 8/2007 | Dou et al. |
| 2007/0248238 A1 | 10/2007 | Abreu et al. |
| 2007/0285326 A1 | 12/2007 | McKinzie |
| 2007/0293176 A1 | 12/2007 | Yu |
| 2008/0007478 A1 | 1/2008 | Jung |
| 2008/0018541 A1 | 1/2008 | Pang |
| 2008/0030165 A1 | 2/2008 | Lisac et al. |
| 2008/0055016 A1 | 3/2008 | Morris |
| 2008/0055168 A1 | 3/2008 | Massey et al. |
| 2008/0081670 A1 | 4/2008 | Rofougaran |
| 2008/0090539 A1 | 4/2008 | Thompson |
| 2008/0094149 A1 | 4/2008 | Brobston |
| 2008/0106350 A1 | 5/2008 | McKinzie |
| 2008/0122553 A1 | 5/2008 | McKinzie |
| 2008/0122723 A1 | 5/2008 | Rofougaran |
| 2008/0129612 A1 | 6/2008 | Wang |
| 2008/0158076 A1 | 7/2008 | Walley |
| 2008/0261544 A1 | 10/2008 | Blin |
| 2008/0274706 A1 | 11/2008 | Blin |
| 2008/0285729 A1 | 11/2008 | Glasgow et al. |
| 2008/0294718 A1 | 11/2008 | Okano |
| 2008/0300027 A1 | 12/2008 | Dou et al. |
| 2008/0305749 A1 | 12/2008 | Ben-Bassat |
| 2008/0305750 A1 | 12/2008 | Alon et al. |
| 2008/0309617 A1 | 12/2008 | Kong et al. |
| 2009/0002077 A1 | 1/2009 | Rohani et al. |
| 2009/0027286 A1 | 1/2009 | Ohishi |
| 2009/0039976 A1 | 2/2009 | McKinzie, III |
| 2009/0082017 A1 | 3/2009 | Chang et al. |
| 2009/0109880 A1 | 4/2009 | Kim et al. |
| 2009/0121963 A1 | 5/2009 | Greene |
| 2009/0149136 A1 | 6/2009 | Rofougaran |
| 2009/0180403 A1 | 7/2009 | Tudosoiu |
| 2009/0184879 A1 | 7/2009 | Derneryd |
| 2009/0215446 A1 | 8/2009 | Hapsari et al. |
| 2009/0231220 A1 | 9/2009 | Zhang et al. |
| 2009/0253385 A1 | 10/2009 | Dent et al. |
| 2009/0264065 A1 | 10/2009 | Song |
| 2009/0278685 A1 | 11/2009 | Potyrailo |
| 2009/0295651 A1 | 12/2009 | Dou et al. |
| 2009/0323572 A1 | 12/2009 | Shi et al. |
| 2009/0323582 A1 | 12/2009 | Proctor et al. |
| 2010/0041348 A1 | 2/2010 | Wilcox et al. |
| 2010/0053009 A1 | 3/2010 | Rofougaran |
| 2010/0060531 A1 | 3/2010 | Rappaport |
| 2010/0073103 A1 | 3/2010 | Spears et al. |
| 2010/0085260 A1 | 4/2010 | McKinzie |
| 2010/0085884 A1 | 4/2010 | Srinivasan et al. |
| 2010/0105425 A1 | 4/2010 | Asokan |
| 2010/0107067 A1 | 4/2010 | Vaisanen et al. |
| 2010/0134215 A1 | 6/2010 | Lee et al. |
| 2010/0156552 A1 | 6/2010 | McKinzie |
| 2010/0232474 A1 | 9/2010 | Rofougaran et al. |
| 2010/0244576 A1 | 9/2010 | Hillan et al. |
| 2010/0285836 A1 | 11/2010 | Horihata et al. |
| 2010/0302106 A1 | 12/2010 | Knudsen et al. |
| 2010/0304688 A1 | 12/2010 | Knudsen |
| 2011/0002080 A1 | 1/2011 | Ranta |
| 2011/0012790 A1 | 1/2011 | Badaruzzaman |
| 2011/0014879 A1 | 1/2011 | Alberth et al. |
| 2011/0043328 A1 | 2/2011 | Bassali |
| 2011/0086600 A1 | 4/2011 | Muhammad |
| 2011/0086630 A1 | 4/2011 | Manssen |
| 2011/0102290 A1 | 5/2011 | Milosavljevic |
| 2011/0105023 A1 | 5/2011 | Scheer et al. |
| 2011/0116423 A1 | 5/2011 | Rousu et al. |
| 2011/0117863 A1 | 5/2011 | Camp, Jr. et al. |
| 2011/0117973 A1 | 5/2011 | Asrani et al. |
| 2011/0121079 A1 | 5/2011 | Lawrence et al. |
| 2011/0122040 A1 | 5/2011 | Wakabayashi et al. |
| 2011/0133994 A1 | 6/2011 | Korva |
| 2011/0140982 A1 | 6/2011 | Ozden et al. |
| 2011/0183628 A1 | 7/2011 | Baker |
| 2011/0183633 A1 | 7/2011 | Ohba et al. |
| 2011/0195679 A1 | 8/2011 | Lee et al. |
| 2011/0237207 A1 | 9/2011 | Bauder |
| 2011/0249760 A1 | 10/2011 | Chrisikos et al. |
| 2011/0256857 A1 | 10/2011 | Chen et al. |
| 2011/0281532 A1 | 11/2011 | Shin et al. |
| 2011/0299438 A1 | 12/2011 | Mikhemar et al. |
| 2011/0306310 A1 | 12/2011 | Bai |
| 2011/0309980 A1 | 12/2011 | Ali et al. |
| 2012/0051409 A1 | 3/2012 | Brobston et al. |
| 2012/0062431 A1 | 3/2012 | Tikka et al. |
| 2012/0075159 A1 | 3/2012 | Chang |
| 2012/0084537 A1 | 4/2012 | Indukuru et al. |
| 2012/0094708 A1 | 4/2012 | Park |
| 2012/0100802 A1 | 4/2012 | Mohebbi |
| 2012/0112851 A1 | 5/2012 | Manssen |
| 2012/0112852 A1 | 5/2012 | Manssen et al. |
| 2012/0119843 A1 | 5/2012 | du Toit et al. |
| 2012/0119844 A1 | 5/2012 | du Toit et al. |
| 2012/0214421 A1 | 8/2012 | Hoirup |
| 2012/0220243 A1 | 8/2012 | Mendolia |
| 2012/0243579 A1 | 9/2012 | Premakanthan et al. |
| 2012/0286586 A1 | 11/2012 | Balm |
| 2012/0293384 A1 | 11/2012 | Knudsen et al. |
| 2012/0295554 A1 | 11/2012 | Greene et al. |
| 2012/0295555 A1 | 11/2012 | Greene et al. |
| 2013/0005277 A1 | 1/2013 | Klomsdorf et al. |
| 2013/0052967 A1 | 2/2013 | Black et al. |
| 2013/0056841 A1* | 3/2013 | Hsieh et al. .................. 257/419 |
| 2013/0076579 A1 | 3/2013 | Zhang et al. |
| 2013/0076580 A1 | 3/2013 | Zhang et al. |
| 2013/0106332 A1 | 5/2013 | Williams et al. |
| 2013/0122829 A1 | 5/2013 | Hyvonen et al. |
| 2013/0137384 A1 | 5/2013 | Desclos et al. |
| 2013/0154897 A1* | 6/2013 | Sorensen et al. ............. 343/861 |
| 2013/0215846 A1 | 8/2013 | Yerrabommanahalli et al. |
| 2013/0315285 A1 | 11/2013 | Black et al. |
| 2014/0002323 A1 | 1/2014 | Ali et al. |

FOREIGN PATENT DOCUMENTS

| | | |
|---|---|---|
| DE | 102008050743 | 4/2010 |
| DE | 102009018648 A1 | 10/2010 |
| EP | 0685936 | 6/1995 |
| EP | 0909024 | 4/1999 |
| EP | 1079296 | 2/2001 |
| EP | 1137192 | 9/2001 |
| EP | 1298810 | 4/2006 |
| EP | 2214085 A2 | 8/2010 |
| EP | 2328233 | 6/2011 |
| EP | 2388925 A1 | 11/2011 |
| EP | 2424119 A1 | 2/2012 |
| JP | 03276901 | 3/1990 |
| JP | 02-077580 | 9/1991 |
| JP | 9321526 | 12/1997 |
| JP | 10209722 | 8/1998 |
| JP | 2005-130441 | 5/2005 |
| KR | 100645526 | 11/2006 |
| KR | 10-0740177 | 7/2007 |
| WO | 01/71846 | 9/2001 |
| WO | 2006/031170 | 3/2006 |
| WO | 2008/030165 | 3/2008 |
| WO | WO-2009/064968 | 5/2009 |
| WO | 2009/108391 A1 | 9/2009 |
| WO | 2009/155966 | 12/2009 |
| WO | 2010121914 A1 | 10/2010 |
| WO | WO-2011/044592 | 4/2011 |
| WO | 2011/084716 | 7/2011 |
| WO | WO-2011/133657 | 10/2011 |
| WO | WO-2011028453 | 10/2011 |

(56) References Cited

FOREIGN PATENT DOCUMENTS

| WO | 2012/067622 | 5/2012 |
|---|---|---|
| WO | 2012/085932 | 6/2012 |

OTHER PUBLICATIONS

Du Toit, , "Tunable Microwave Devices With Auto Adjusting Matching Circuit", U.S. Appl. No. 13/302,617, filed Nov. 22, 2011.
Du Toit, , "Tunable Microwave Devices With Auto-Adjusting Matching Circuit", U.S. Appl. No. 13/302,649, filed Nov. 22, 2011.
Greene, , "Method and Apparatus for Tuning a Communication Device", U.S. Appl. No. 13/108,463, filed May 16, 2011.
Greene, , "Method and Apparatus for Tuning a Communication Device", U.S. Appl. No. 13/108,589, filed May 16, 2011.
Hoirup, , "Method and Apparatus for Radio Antenna Frequency Tuning", U.S. Appl. No. 13/030,177, filed Feb. 18, 2011.
Huang, Libo et al., "Theoretical and experimental investigation of adaptive antenna impedance matching for multiband mobile phone applications", IEEE, Sep. 7, 2005, 13-17.
Hyun, S. , "Effects of strain on the dielectric properties of tunable dielectric SrTi03 thin films", Applied Physics Letters, 2004 American Institute of Physics.
Ida, I. et al., "An Adaptive Impedence Matching System and Its Application to Mobile Antennas", TENCON 2004, IEEE Region 10 Conference, See Abstract ad p. 544, Nov. 21-24, 2004, 543-547.
Katsuya, K. , "Hybrid Integrated Circuit Device", Patent Abstracts of Japan, Publication No. 03-276901, Date of publication of application: Sep. 12, 1991.
Manssen, , "Method and Apparatus for Managing Interference in a Communication Device", U.S. Appl. No. 61/326,206, filed Apr. 20, 2010.
Manssen, , "Method and Apparatus for Tuning Antennas in a Communication Device", U.S. Appl. No. 12/941,972, filed Nov. 8, 2010.
Manssen, , "Method and Apparatus for Tuning Antennas in a Communication Device", U.S. Appl. No. 13/005,122, filed Jan. 12, 2011.
McKinzie, , "Adaptive Impedance Matching Module (AIMM) Control Architectures", U.S. Appl. No. 13/293,550, filed Nov. 10, 2011.
McKinzie, , "Method and Apparatus for Adaptive Impedance Matching", U.S. Appl. No. 13/217,748, filed Aug. 25, 2011.
Mendolia, , "Method and Apparatus for Tuning a Communication Device", U.S. Appl. No. 13/035,417, filed Feb. 25, 2011.
Paratek Microwave, Inc., , "Method and Appartus for Tuning Antennas in a Communication Device", International Application No. PCT/US11/59620; Filed Nov. 7, 2011.
Patent Cooperation Treaty, , "International Search Report and Written Opinion", International Application No. PCT/US2010/046241, Mar. 2, 2011.
Patent Cooperation Treaty, , "International Search Report and Written Opinion", International Application No. PCT/US2010/056413, Jul. 27, 2011.
Patent Cooperation Treaty, , "International Search Report and Written Opinion", Nov. 16, 2011, International Application No. PCT/US/2011/038543.
Patent Cooperation Treaty, , "International Search Report and Written Opinion", PCT Application No. PCT/US08/005085, Jul. 2, 2008.
Payandehjoo, Kasra , "Novel Techniques for Coupling Reduction in Multi-Antenna Hand-held Devices", IEEE Student Member, 1-8.
Pervez, N. K. , "High Tunability barium strontium titanate thin films for RF circuit applications", Applied Physics Letters, 2004 American Institute of Physics.
Petit, Laurent , "MEMS-Switched Parasitic-Antenna Array for Radiation Pattern Diversity", IEEE Transactions on Antennas and Propagation, vol. 54, No. 9, Sep. 2009, 2624-2631.
Qiao, et al., "Antenna Impedance Mismatch Measurement and Correction for Adaptive COMA Transceivers", IEEE, 2005.
Qiao, et al., "Measurement of Antenna Load Impedance for Power Amplifiers", The Department of Electrical and Computer Engineering, University of California, San Diego, Sep. 13, 2004.
Spears, , "Methods for Tuning an Adaptive Impedance Matching Network With a Look-Up Table", U.S. Appl. No. 13/297,951, filed Nov. 16, 2011.
Stemmer, Susanne , "Low-loss tunable capacitors fabricated directly on gold bottom electrodes", University of California Postprints 2006.
Taylor, T.R. , "Impact of thermal strain on the dielectric constant of sputtered barium strontium titanate thin films", Applied Physics Letters, 2002 American Institute of Physics.
Tombak, Ali , "Tunable Barium Strontium Titanate Thin Film Capacitors for RF and Microwave Applications", IEEE Microwave and Wireles Components Letters, vol. 12, Jan. 2002.
Xu, Hongtao , "Tunable Microwave Integrated Circuits using BST Thin Film Capacitors with Device", Integrated Ferroelectrics, Department of Electrical Engineering and Computer Engineering, University of California, 2005.
Zuo, S. , "Eigenmode Decoupling for Mimo Loop-Antenna Based on 180 Coupler", Progress in Electromagnetics Research Letters, vol. 26, 2011, 11-20.
Payandehjoo, Kasra et al., "Investigation of Parasitic Elements for Coupling Reduction in MultiAntenna Hand-Set Devices", Published online Jan. 22, 2013 in Wiley Online Library (wileyonlinelibrary.com).

\* cited by examiner

LOOK-UP TABLE

| |
|---|
| Band 1; Use Case 1; Desired tuning state |
| Band 1; Use Case 2; Desired tuning state |
| ⋮ |
| Band 1; Use Case n; Desired tuning state |
| Band 2; Use Case 1; Desired tuning state |
| Band 2; Use Case 2; Desired tuning state |
| ⋮ |
| Band 2; Use Case n; Desired tuning state |
| ⋮ |
| Band N; Use Case 1; Desired tuning state |
| Band N; Use Case 2; Desired tuning state |
| ⋮ |
| Band N; Use Case n; Desired tuning state |

FIG. 7

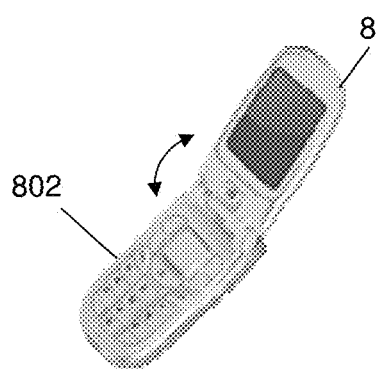
800
FIG. 8
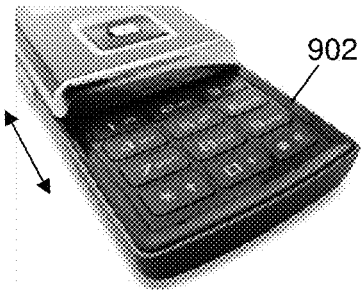
900
FIG. 9
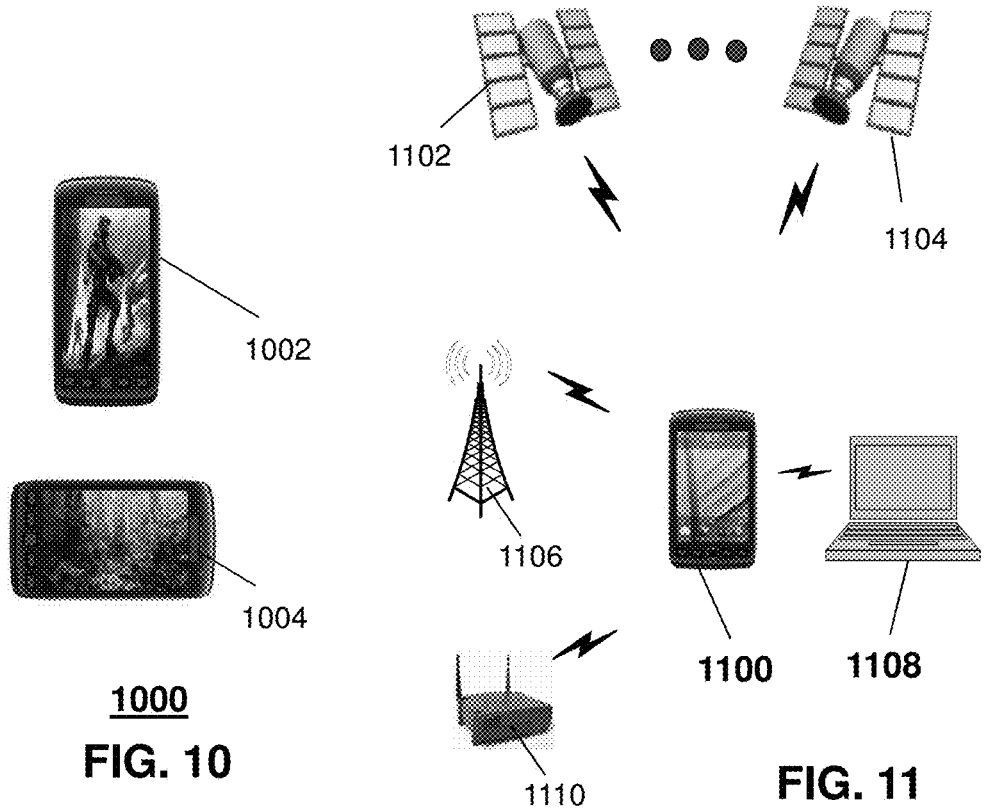
1000
FIG. 10
FIG. 11

FIG. 18B (SECTION A-A')

ANTENNA TUNING FOR MULTIBAND OPERATION

FIELD OF THE DISCLOSURE

The subject disclosure relates generally to antennas and more particularly to tunable multi-band antennas.

BACKGROUND

Cellular communication devices such as cellular telephones, tablets, and laptops can support multi-cellular access technologies, peer-to-peer access technologies, personal area network access technologies, and location receiver access technologies, which can operate concurrently. Cellular communication devices have also integrated a variety of consumer features such as MP3 players, color displays, gaming applications, cameras, and other features. Cellular communication devices can be required to communicate at a variety of frequencies, and in some instances are subjected to a variety of physical and functional use conditions.

In some instances, such communication devices are required to operate within different frequency bands, referred to generally as multi-band operation. For example, a cellular communication device may be required to operate in a low-frequency cellular band, e.g., for voice communications, and in a relatively high-frequency cellular band, e.g., for data communications. Additionally, with advancements in mobile communications devices resulting in smaller packages with greater functionality, such a demand for multi-band operation without a corresponding proliferation of antennas is desirable.

Multiband antennas can provide coverage within different operating bands, such as a planar inverted "F" antenna (PIFA) used in mobile communications devices. Unfortunately, however, such antennas typically provide relatively narrow operational bandwidths determined by resonances of the multiband antenna structures. Thus, if greater bandwidth coverage is required, additional elements area may be added, adding to the size and complexity of the multiband antenna structure.

BRIEF DESCRIPTION OF THE DRAWINGS

Reference will now be made to the accompanying drawings, which are not necessarily drawn to scale, and wherein:

FIG. 7 depicts an illustrative embodiment of a look-up table utilized by the communication device of FIG. 1 for controlling tunable reactive elements utilized by the communication device;

FIGS. 8-11 depict illustrative physical and operational use cases of a communication device;

FIGS. 18A-18C depict planar and sectional views of a portion of a circuit assembly including dual-band, independently tunable antenna assembly.

DETAILED DESCRIPTION

Figure 1:
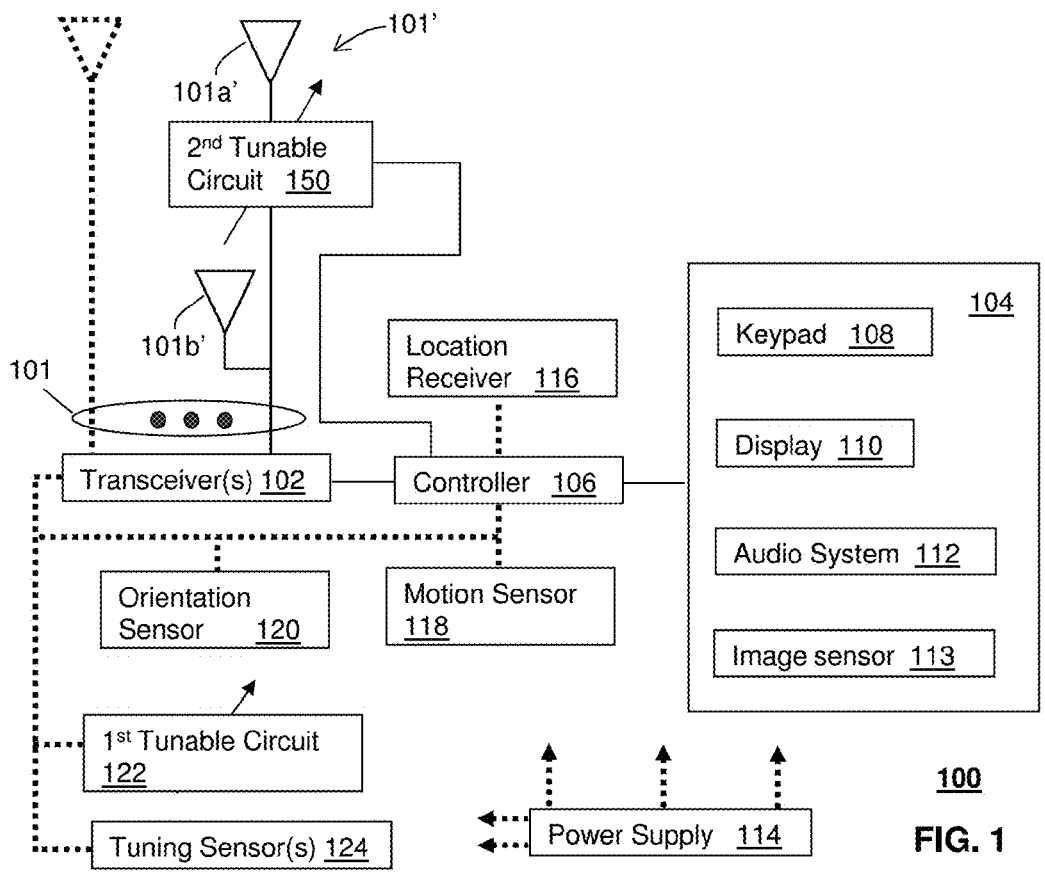
FIG. 1 depicts an illustrative embodiment of a communication device.

The subject disclosure describes, among other things, illustrative embodiments of tunable multiband antennas, in which at least one operating band of a multiband antenna is independently tunable, without affecting other operating bands of the same antenna. Thus, a limited number of resonant portions of a multiband radiating structure are able to cover a greater operational bandwidth than would otherwise be possible. Other embodiments are described by the subject disclosure.

One embodiment of the subject disclosure includes a multiband antenna having a feed port and a first radiating portion coupled to the feed port. The first radiating portion defines a first resonant bandwidth. The multiband antenna also includes a second radiating portion coupled to the feed port and defining a second resonant bandwidth differing from the first resonant bandwidth. The second radiating element includes a proximal radiating segment coupled to the feed port, a distal radiating segment physically isolated from the proximal radiating segment and the feed port, and an adjustable tuning circuit. The adjustable tuning circuit is coupled between the proximal radiating segment and the distal radiating segment. Adjustment of the tuning circuit modifies the second resonant bandwidth, without altering the first resonant bandwidth.

Another embodiment of the subject disclosure includes a process that includes identifying, by a system including at least one processor, a desired frequency for operation of a multiband antenna comprising a number of radiating portions. Each radiating portion contributes a different respective resonance bandwidth that can be realized at an antenna port. One of the radiating portions is selected, by the system to accommodate operation of the multiband antenna at the desired frequency. A tuning circuit is coupled between adjoining radiating segments of the selected radiating portion. The tuning circuit is adjusted, by the system, thereby altering a resonance of the selected radiating portion, such that a resonant bandwidth of the selected radiating portion includes the desired frequency. Such adjustment of the resonant bandwidth of the selected radiating portion is accomplished without altering resonance bandwidths of non-selected radiating portions of the number of radiating portions of the multiband antenna.

Yet another embodiment of the subject disclosure includes a communications device including at least one of a transmitter or a receiver and a multiband antenna. The multiband antenna includes a feed port and a number of radiating portions. Each radiating portion of the number of radiating portions is coupled to the feed port and defines a respective resonant bandwidth. The multiband antenna also includes at least one adjustable reactive impedance coupled between a proximal radiating segment and a distal radiating segment of a respective radiating portion of the number of radiating portions. Adjustment of the at least one reactive impedance modifies the respective resonant bandwidth, without altering the resonant bandwidths of other radiating portions of the number of radiating portions.

FIG. 1 depicts an illustrative embodiment of a communication device 100. The communication device 100 can comprise one or more transceivers 102 coupled to one or more antennas 101, each transceiver having transmitter and receiver sections (herein transceiver 102 or transceivers 102), a tunable circuit 122, one or more tuning sensors 124, a user interface (UI) 104, a power supply 114, a location receiver 116, a motion sensor 118, an orientation sensor 120, and a controller 106 for managing operations thereof. The transceiver 102 can support short-range or long-range wireless access technologies such as Bluetooth, ZigBee, Wireless Fidelity (WiFi), Digital Enhance Cordless Telecommunications (DECT), or cellular communication technologies, just to mention a few.

One or more of the antennas 101 can be a multi-band antenna configured to operate in different operating frequency bands. An example multiband antenna 101' is illustrated including a first resonant portion 101a' having a resonance within a first operational bandwidth and a second resonant portion 101b' having a resonance within a second, different operational bandwidth. In at least some embodiments, each of the different operating bandwidths can be selected independently of any other operating bandwidths of the same antenna 101'. In at least some embodiments, the multiband antenna 101' includes at least one second tunable circuit 150 associated with a respective one of the first and second resonant portions 101a', 101b'. The tunable circuit is operable to selectively alter resonant performance of the associated resonant portion 101a', 101b', thereby changing the operational bandwidth. In the illustrative embodiment, the tuning circuit 150 is associated with the first resonant portion 101a'.

Cellular technologies can include, for example, Global System for Mobile (GSM), Code Division Multiple Access (CDMA), Time Division Multiple Access (TDMA), Universal Mobile Telecommunications (UMTS), World interoperability for Microwave (WiMAX), Software Defined Radio (SDR), Long Term Evolution (LTE), as well as other next generation wireless communication technologies as they arise. The transceiver 102 can also be adapted to support circuit-switched wireline access technologies such as Public Switched Telephone Network (PSTN), packet-switched wireline access technologies such as TCP/IP, Voice over IP—VoIP, etc., or combinations thereof. Operational bandwidths of the one or more antennas 101 can be selected based on one or more of such cellular technologies, alone or in combination with other wireless technologies, such as one or more of wireless Local Area Networks (LANs), e.g., IEEE 802.11 technologies generally known as Wireless Fidelity (Wi-Fi), wireless Personal Area Networks (PANs), such as BLUETOOTH, and navigational systems, such as the Global Positioning System (GPS), and the like.

The first and second tunable circuits 122, 150 can comprise variable reactive elements such as variable capacitors, variable inductors, or combinations thereof that are tunable with digital and/or analog bias signals. The first tunable circuit 122 can represent a tunable matching network coupled to the antenna 101 to compensate for a change in impedance of the antenna 101, a compensation circuit to compensate for mutual coupling in a multi-antenna system, an amplifier tuning circuit to control operations of an amplifier of the transceiver 102, a filter tuning circuit to alter a pass band of a filter used by the transceiver 102, and so on.

Figure 2:
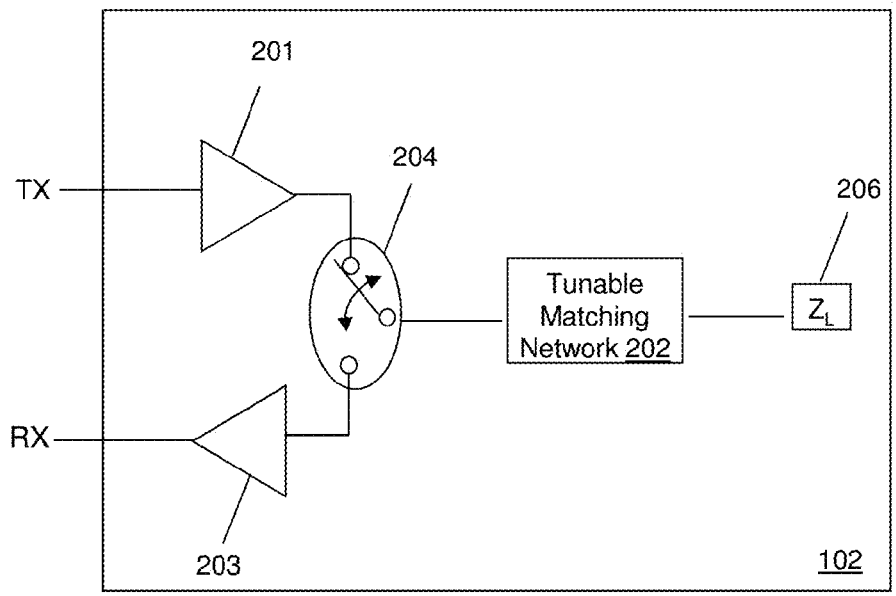
FIG. 2 depicts an illustrative embodiment of a portion of a transceiver of the communication device of FIG. 1.

The tuning sensors 124 can be placed at any stage of the transceiver 102 such as, for example, before or after a matching network 202, and/or at a power amplifier 201 as shown in FIG. 2. Alternatively or in addition, the tuning sensors 124 can be placed between the transceiver and one or more of the antennas 101, and along one or more resonant segments 101a', 101b' of a multiband antenna 101'. The tuning sensors 124 can utilize any suitable sensing technology such as directional couplers, voltage dividers, or other sensing technologies to measure signals at any stage of the transceiver 102, between the transceiver 102 and one or more of the antennas 101, and along one or more resonant segments 101a', 101b' of a multiband antenna 101'. The digital samples of the measured signals can be provided to the controller 106 by way of analog-to-digital converters included in the tuning sensors 124. Data provided to the controller 106 by the tuning sensors 124 can be used to measure, for example, one or more of transmit power, transmitter efficiency, receiver sensitivity, power consumption of the communication device 100, resonant currents, e.g., current magnitude, frequency band selectivity by adjusting filter passbands, linearity and efficiency of power amplifiers, specific absorption rate (SAR) requirements, and so on. The controller 106 can be configured to execute one or more tuning algorithms to determine desired tuning states of one or more of the first and second tunable circuits 122, 150 based on the foregoing measurements.

In at least some embodiments, such tuning algorithms function cooperatively to determine desired tuning states. For example, such a cooperative tuning algorithm can initially tune one of the first and second tunable circuits 122, 150, and subsequently tune another of the first and second tunable circuits 122, 150. The cooperative tuning process can be repeated, for example, to refine tuning of one or more of the first and second tunable circuits. Such cooperative tuning algorithms can operate similarly for embodiments having one or more of either or both of the first and second tunable circuits 122. For example, a match network 122 might be tuned to an initial state, and one of a number of second tunable circuits tuned to a respective state. Another of the second tunable circuits can be tuned to a respective state, continuing, and possibly retuning, until an overall system tuned state is achieved.

The UI 104 can include a depressible or touch-sensitive keypad 108 with a navigation mechanism such as a roller ball, a joystick, a mouse, or a navigation disk for manipulating operations of the communication device 100. The keypad 108 can be an integral part of a housing assembly of the communication device 100 or an independent device operably coupled thereto by a tethered wireline interface (such as a USB cable) or a wireless interface supporting, for example, Bluetooth. The keypad 108 can represent a numeric keypad commonly used by phones, and/or a QWERTY keypad with alphanumeric keys. The UI 104 can further include a display 110 such as monochrome or color LCD (Liquid Crystal Display), OLED (Organic Light Emitting Diode) or other suitable display technology for conveying images to an end user of the communication device 100. In an embodiment where the display 110 is touch-sensitive, a portion or all of the keypad 108 can be presented by way of the display 110 with navigation features.

The display 110 can use touch screen technology to also serve as a user interface for detecting user input. As a touch screen display, the communication device 100 can be adapted to present a user interface with graphical user interface (GUI) elements that can be selected by a user with a touch of a finger.

The touch screen display 110 can be equipped with capacitive, resistive or other forms of sensing technology to detect how much surface area of a user's finger has been placed on a portion of the touch screen display. This sensing information can be used to control the manipulation of the GUI elements or other functions of the user interface. The display 110 can be an integral part of the housing assembly of the communication device 100 or an independent device communicatively coupled thereto by a tethered wireline interface (such as a cable) or a wireless interface.

The UI 104 can also include an audio system 112 that utilizes audio technology for conveying low volume audio (such as audio heard in proximity of a human ear) and high volume audio (such as speakerphone for hands free operation). The audio system 112 can further include a microphone for receiving audible signals of an end user. The audio system 112 can also be used for voice recognition applications. The UI 104 can further include an image sensor 113 such as a charged coupled device (CCD) camera for capturing still or moving images.

The power supply 114 can utilize common power management technologies such as replaceable and rechargeable batteries, supply regulation technologies, and/or charging system technologies for supplying energy to the components of the communication device 100 to facilitate long-range or short-range portable applications. Alternatively, or in combination, the charging system can utilize external power sources such as DC power supplied over a physical interface such as a USB port or other suitable tethering technologies.

The location receiver 116 can utilize location technology such as a global positioning system (GPS) receiver capable of assisted GPS for identifying a location of the communication device 100 based on signals generated by a constellation of GPS satellites, which can be used for facilitating location services such as navigation. The motion sensor 118 can utilize motion sensing technology such as an accelerometer, a gyroscope, or other suitable motion sensing technology to detect motion of the communication device 100 in three-dimensional space. The orientation sensor 120 can utilize orientation sensing technology such as a magnetometer to detect the orientation of the communication device 100 (north, south, west, and east, as well as combined orientations in degrees, minutes, or other suitable orientation metrics).

The communication device 100 can use the transceiver 102 to also determine a proximity to or distance to cellular, WiFi, Bluetooth, or other wireless access points by sensing techniques such as utilizing a received signal strength indicator (RSSI) and/or signal time of arrival (TOA) or time of flight (TOF) measurements.

The controller 106 can utilize computing technologies such as a microprocessor, a digital signal processor (DSP), and/or a video processor with associated storage memory such as Flash, ROM, RAM, SRAM, DRAM or other storage technologies for executing computer instructions, controlling, and processing data supplied by the aforementioned components of the communication device 100.

Other components not shown in FIG. 1 can be used by the subject disclosure. The communication device 100 can include a slot for inserting or removing an identity module such as a Subscriber Identity Module (SIM) card. SIM cards can be used for identifying and registering for subscriber services, executing computer programs, storing subscriber data, and so forth.

Other components not shown in FIG. 1 can be added to the communication device 100. For example, the communication device 100 can include a slot for inserting or removing an identity module such as a Subscriber Identity Module (SIM) card. SIM cards can be used for identifying and registering subscriber services, executing computer programs, storing subscriber data, and so forth.

Referring again to FIG. 2, an illustrative embodiment is depicted of a portion of the wireless transceiver 102 of the communication device 100 of FIG. 1. In GSM applications, the transmit and receive portions of the transceiver 102 can include amplifiers 201, 203 coupled to a tunable matching network 202 that is in turn coupled to an impedance load 206. The impedance load 206 in the present illustration can be an antenna as shown in FIG. 1 (herein antenna 206). A transmit signal in the form of a radio frequency (RF) signal (TX) can be directed to the amplifier 201 which amplifies the signal and directs the amplified signal to the antenna 206 by way of the tunable matching network 202 when switch 204 is enabled for a transmission session. The receive portion of the transceiver 102 can utilize a pre-amplifier 203 which amplifies signals received from the antenna 206 by way of the tunable matching network 202 when switch 204 is enabled for a receive session. Other configurations of FIG. 2 are possible for other types of cellular access technologies such as CDMA, UMTS, LTE, and so forth. These undisclosed configurations are applicable to the subject disclosure.

Figure 3:
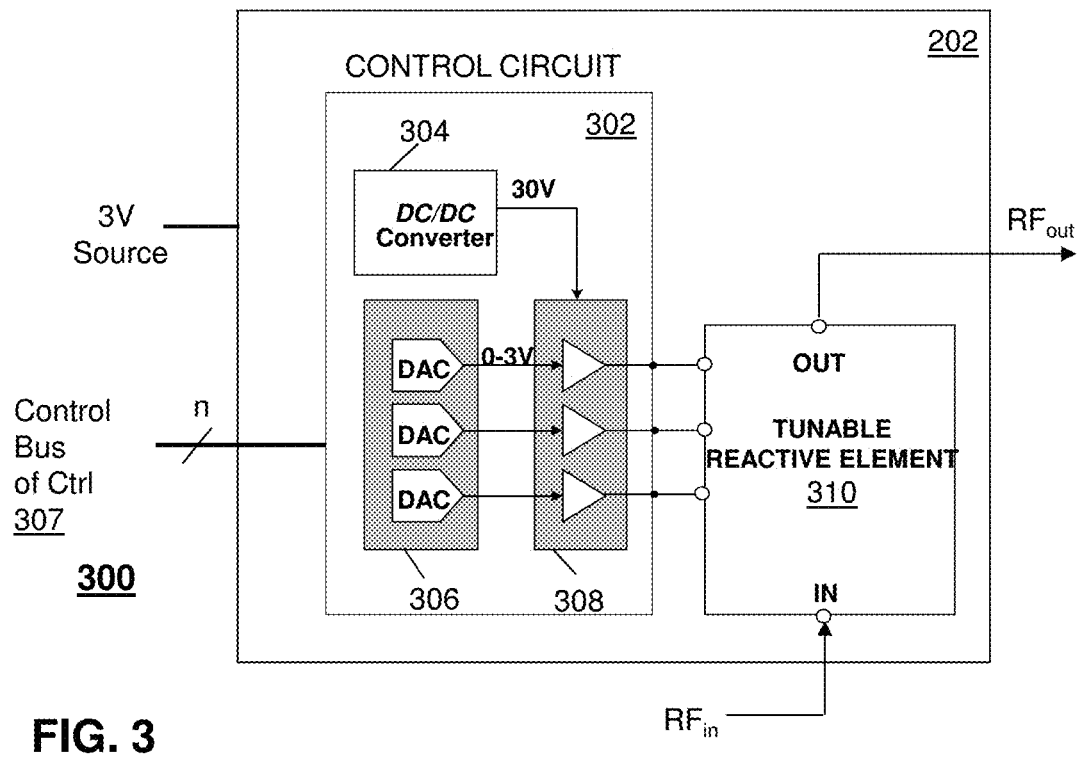
FIGS. 3-6B depict illustrative embodiments of a tunable matching network of the transceiver of FIG. 2.
Figure 4:
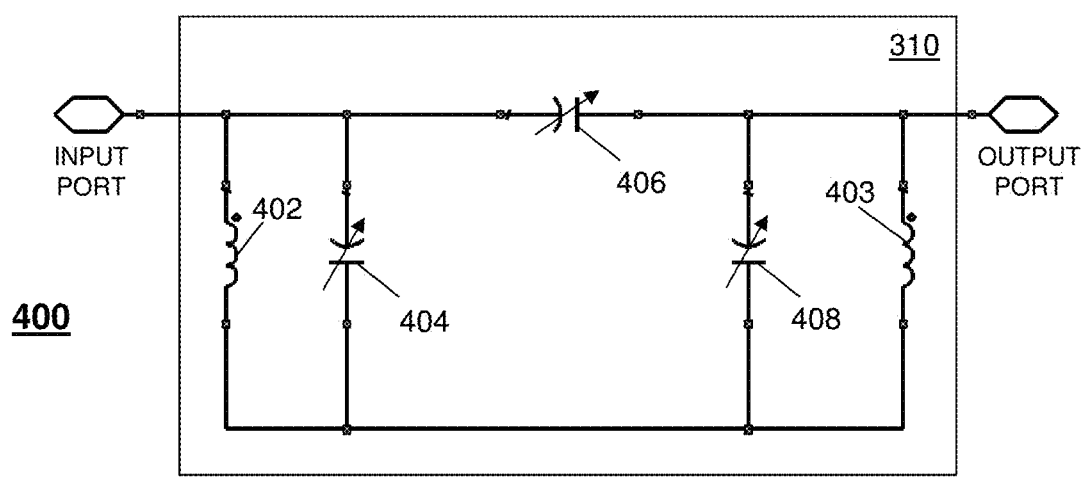

FIGS. 3 and 4 depict illustrative embodiments of a tunable circuit 122, 150, such as the tunable matching network 202 of the transceiver 102 of FIG. 2. In one embodiment, the tunable matching network 202 can comprise a control circuit 302 and a tunable reactive element 310. The control circuit 302 can comprise a DC-to-DC converter 304, one or more digital-to-analog converters (DACs) 306 and one or more corresponding buffers 308 to amplify the voltage generated by each DAC. The amplified signal can be fed to one or more tunable reactive components 404, 406 and 408 such as shown in FIG. 4, which depicts a possible circuit configuration for the tunable reactive element 310. In this illustration, the tunable reactive element 310 includes three tunable capacitors 404-408 and two inductors 402-403 with a fixed inductance. Circuit configurations such as "Tee", "Pi", and "L" configurations for a matching circuit are also suitable configurations that can be used in the subject disclosure. Although the illustrative embodiment refers to the tunable matching network 202, it is understood that the disclosure related to such tunable circuits can be applied to any of the tunable circuits disclosed herein, such as the tunable circuits 122, 150 illustrated in FIG. 1.

The tunable capacitors 404-408 can each utilize technology that enables tunability of the reactance of the component. One embodiment of the tunable capacitors 404-408 can utilize voltage or current tunable dielectric materials. The tunable dielectric materials can utilize, among other things, a composition of barium strontium titanate (BST). Alternatively or in addition, the tunable reactive element 310 can utilize semiconductor varactors, or micro-electromechanical systems (MEMS) technology capable of mechanically varying the dielectric constant of a capacitor. Other present or next generation methods or material compositions that result in a voltage or current tunable reactive element are applicable to the subject disclosure for use by the tunable reactive element 310 of FIG. 3.

The DC-to-DC converter 304 can receive a DC signal such as 3 volts from the power supply 114 of the communication device 100 in FIG. 1. The DC-to-DC converter 304 can use technology to amplify a DC signal to a higher range (e.g., 30 volts) such as shown. The controller 106 can supply digital signals to each of the DACs 306 by way of a control bus 307 of "n" or more wires or traces to individually control the capacitance of tunable capacitors 404-408, thereby varying the collective reactive impedance of the tunable matching network 202. The control bus 307 can be implemented with a two-wire serial bus technology such as a Serial Peripheral Interface (SPI) bus (referred to herein as SPI bus 307). With an SPI bus 307, the controller 106 can transmit serialized digital signals to configure each DAC in FIG. 3. The control circuit 302 of FIG. 3 can utilize digital state machine logic to implement the SPI bus 307, which can direct digital signals supplied by the controller 106 to the DACs to control the analog output of each DAC, which is then amplified by buffers 308. In one embodiment, the control circuit 302 can be a stand-alone component coupled to the tunable reactive element 310. In another embodiment, the control circuit 302 can be integrated in whole or in part with another device such as the controller 106.

Although the tunable reactive element 310 is shown in a unidirectional fashion with an RF input and RF output, the RF signal direction is illustrative and can be interchanged. Additionally, either port of the tunable reactive element 310 can be connected to a feed point of the antenna 206, a structural element of the antenna 206 in an on-antenna configuration, for example along one of the resonant segments 101a', 101b' of a multiband antenna 101' (FIG. 1), or between antennas for compensating mutual coupling when diversity antennas are used, or when antennas of differing wireless access technologies are physically in close proximity to each other and thereby are susceptible to mutual coupling. The tunable reactive element 310 can also be connected to other circuit components of a transmitter or a receiver section such as filters, amplifiers, and so on, to control operations thereof.

Figure 6A:
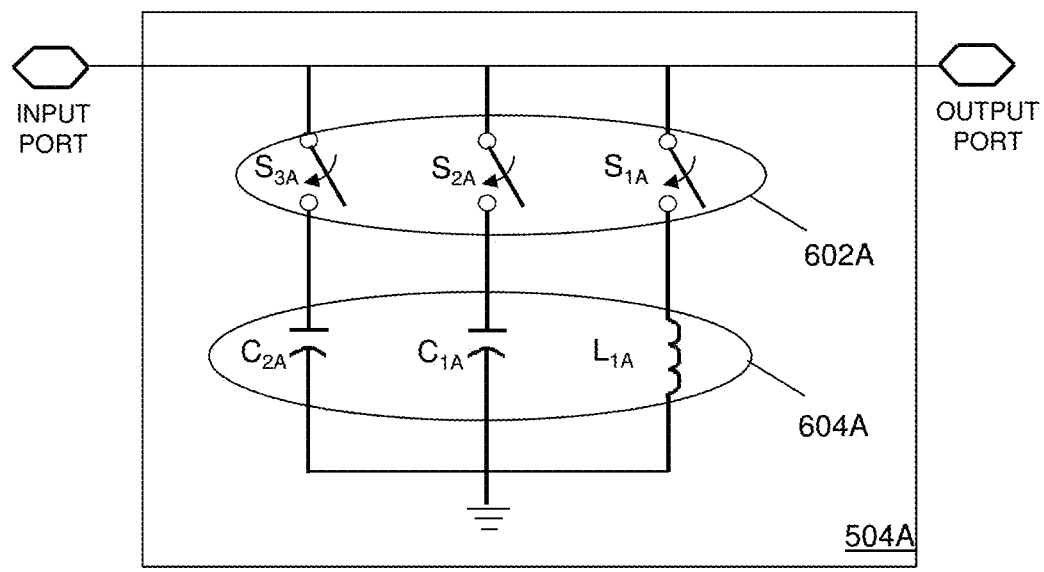
Figure 6B:
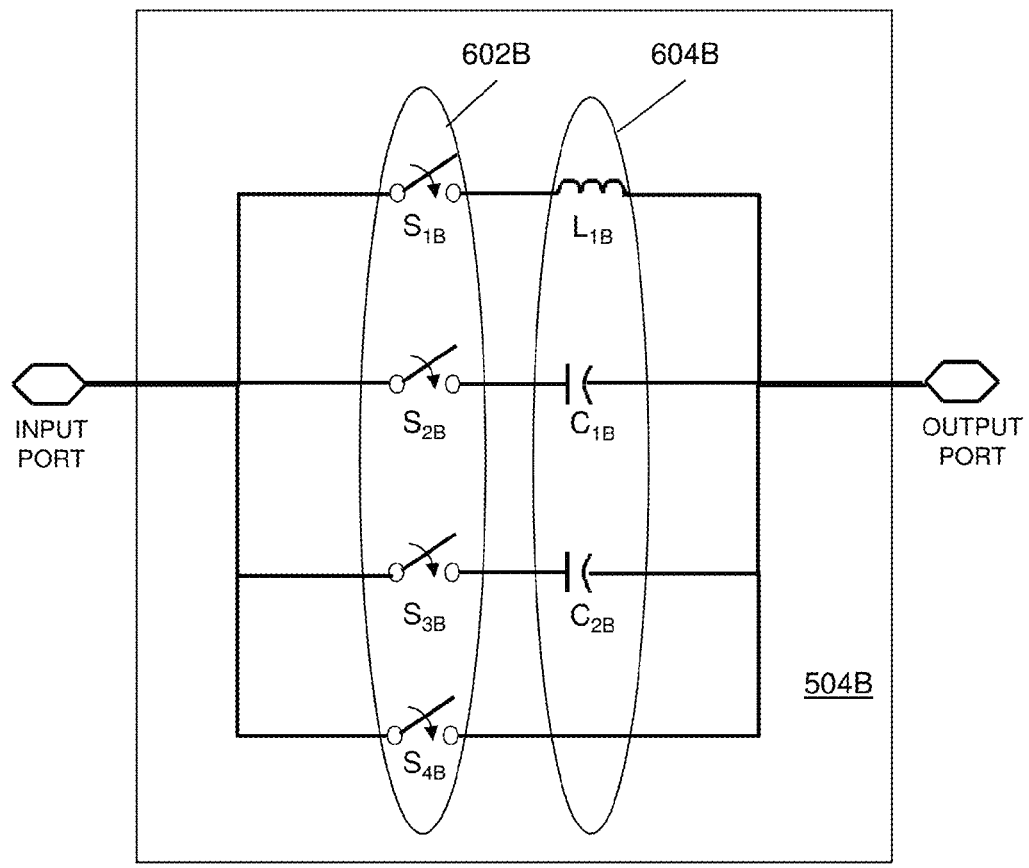

In another embodiment, the tunable matching network 202 of FIG. 2 can comprise a control circuit 502 in the form of a decoder and a tunable reactive element 504 comprising one or more switchable reactive elements such as shown in FIGS. 6A and 6B. In this embodiment, the controller 106 can supply the control circuit 402 signals via the SPI bus 307, which can be decoded with Boolean or state machine logic to individually enable or disable the switching elements 602A, 602B (generally 602). The switching elements 602 can be implemented with semiconductor switches, MEMS, or other suitable switching technology. By independently enabling and disabling the reactive elements 604A, 604B (capacitor or inductor) of FIGS. 6A and 6B with the switching elements 602, the collective reactive impedance of the tunable reactive element 504 can be varied by the controller 106.

Figure 5:
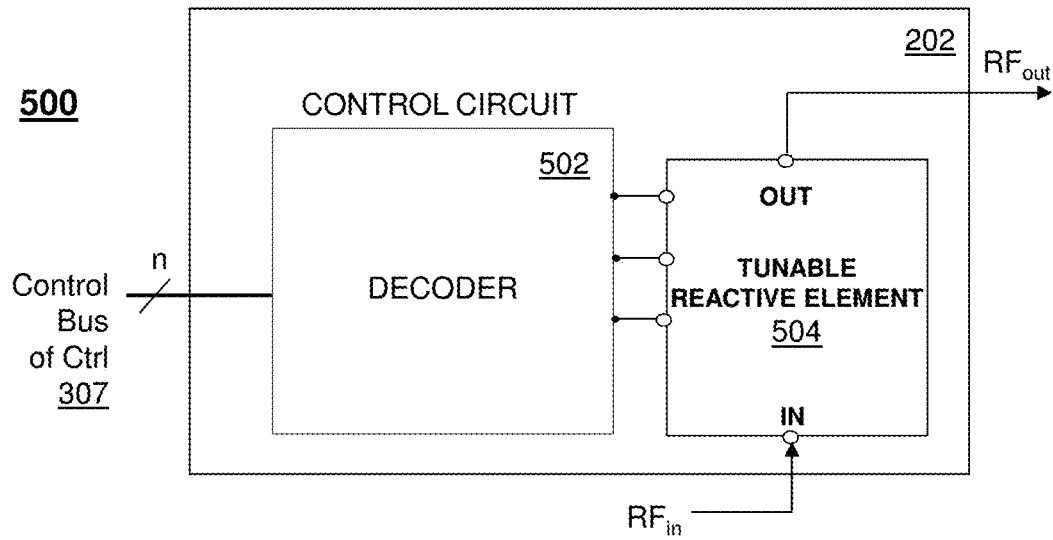

The tunable reactive elements 310 and 504 of FIGS. 3 and 5, respectively, can be used with various circuit components of one or more of the transceiver 102 and the first and second tunable circuits 122, 150 of FIG. 1, to enable the controller 106 to manage performance factors such as, for example, but not limited to, transmit power, transmitter efficiency, receiver sensitivity, power consumption of the communication device 100, frequency band selectivity by adjusting filter passbands, linearity and efficiency of power amplifiers, SAR requirements, among other operational parameters.

FIG. 7 depicts an illustration of a look-up table, for example, stored in a memory, which can be indexed by the controller 106 of the communication device 100 of FIG. 1 according to physical and/or functional use cases of the communication device 100. A physical use case can represent a physical state of the communication device 100, while a functional use case can represent an operational state of the communication device 100. For example, for a flip phone 800 of FIG. 8, an open flip can represent one physical use case, while a closed flip can represent another physical use case. In a closed flip state (i.e., bottom and top flips 802-804 are aligned), a user is likely to have his/her hands surrounding the top flip 802 and the bottom flip 804 while holding the phone 800, which can result in one range of load impedances experienced by an internal or retrievable antenna (not shown) of the phone 800. The range of load impedances of the internal or retrievable antenna can be determined by empirical analysis.

With the flip open a user is likely to hold the bottom flip 802 with one hand while positioning the top flip 804 near the user's ear when an audio system of the phone 800, such audio system 112 of FIG. 1, is set to low volume, and voice channel is active. If, on the other hand, the audio system 112 is in speakerphone mode, it is likely that the user is positioning the top flip 804 away from the user's ear. In these arrangements, different ranges of load impedances can be experienced by the internal or retrievable antenna, which can be analyzed empirically. The low and high volume states of the audio system 112, as well as, a determination that a voice channel is active, illustrates varying functional use cases.

For a phone 900 with a slideable keypad 904 (illustrated in FIG. 9), the keypad in an outward position can present one range of load impedances of an internal antenna, while the keypad in a hidden position can present another range of load impedances, each of which can be analyzed empirically. For a smartphone 1000 (illustrated in FIG. 10) presenting a video game, an assumption can be made that the user is likely to hold the phone away from the user's ear in order to view the game. Placing the smartphone 1000 in a portrait position 1002 can represent one physical and operational use case, while utilizing the smartphone 1000 in a landscape position 1004 presents another physical and operational use case.

The number of hands and fingers used in the portrait mode may be determined by the particular type of game being played by the user. For example, a particular video game may require a user interface where a single finger in portrait mode may be sufficient for controlling the game. In this scenario, it may be assumed that the user is holding the smartphone 1000 in one hand in portrait mode and using a finger with the other. By empirical analysis, a possible range of impedances of the internal antenna(s) of the communication device can be determined when using the video game in portrait mode. Similarly, if the video game selected has a user interface that is known to require two hands in landscape mode, another estimated range of impedances of the internal antenna can be determined empirically.

A multimode phone 1100 capable of facilitating multiple access technologies such as GSM, CDMA, LTE, WiFi, GPS, and/or Bluetooth in two or more combinations can provide additional insight into possible ranges of impedances experienced by two or more internal antennas of the multimode phone 1100. For example, a multimode phone 1100 that provides GPS services by processing signals received from a constellation of satellites 1102, 1104 can be empirically analyzed when other access technologies are also in use. Suppose, for instance, that while navigation services are enabled, the multimode phone 1100 is facilitating voice communications by exchanging wireless messages with a cellular base station 1106. In this state, an internal antenna of the GPS receiver may be affected by a use case of a user holding the multimode phone 1100 (e.g., near the user's ear or away from the user's ear). The effect on the GPS receiver antenna and the GSM antenna by the user's hand position can be empirically analyzed.

Suppose in another scenario that the antenna of a GSM transceiver is in close proximity to the antenna of a WiFi transceiver. Further assume that the GSM frequency band used to facilitate voice communications is near the operational frequency of the WiFi transceiver. Also assume that a use case for voice communications may result in certain physical states of the multimode phone 1100 (e.g., slider out), which can result in a probable hand position of the user of the multimode phone 1100. Such a physical and functional use case can affect the impedance range of the antenna of the WiFi transceiver as well as the antenna of the GSM transceiver.

A close proximity between the WiFi and GSM antennas and the near operational frequency of the antennas may also result in cross-coupling between the antennas. Mutual or cross-coupling under these circumstances can be measured empirically. Similarly, empirical measurements of the impedances of other internal antennas can be measured for particular physical and functional use configurations when utilizing Bluetooth, WiFi, Zigbee, or other access technologies in peer-to-peer communications with another communication device 1108 or with a wireless access point 1110. In diversity designs such as multiple-input and multiple output (MIMO) antennas, physical and functional use cases of a communication device can be measured empirically to determine how best to configure a tunable compensation circuit 122, 150 such as shown in FIG. 1.

The number of physical and functional use cases of a communication device 100 can be substantial when accounting for combinations of access technologies, frequency bands, antennas of different access technologies, antennas configured for diversity designs, and so on. These combinations, however, can be empirically analyzed to determine load impedances of the antenna(s), mutual coupling between them, and the effects on transmitter and receiver performance metrics. Mitigation strategies to reduce mutual coupling, counter the effect of varying load impedances, and to improve other performance metrics of the transceiver 102 can also be determined empirically. The empirical data collected and corresponding mitigation strategies can be recorded in the lookup table of FIG. 7 and indexed according to combinations of physical and functional use cases detected by the communication device 100. The information stored in the look-up table can be used in open-loop RF tuning applications to initialize tunable circuit components of the transceiver 102, as well as, tuning algorithms that control operational aspects of the tunable circuit components.

Figure 12:
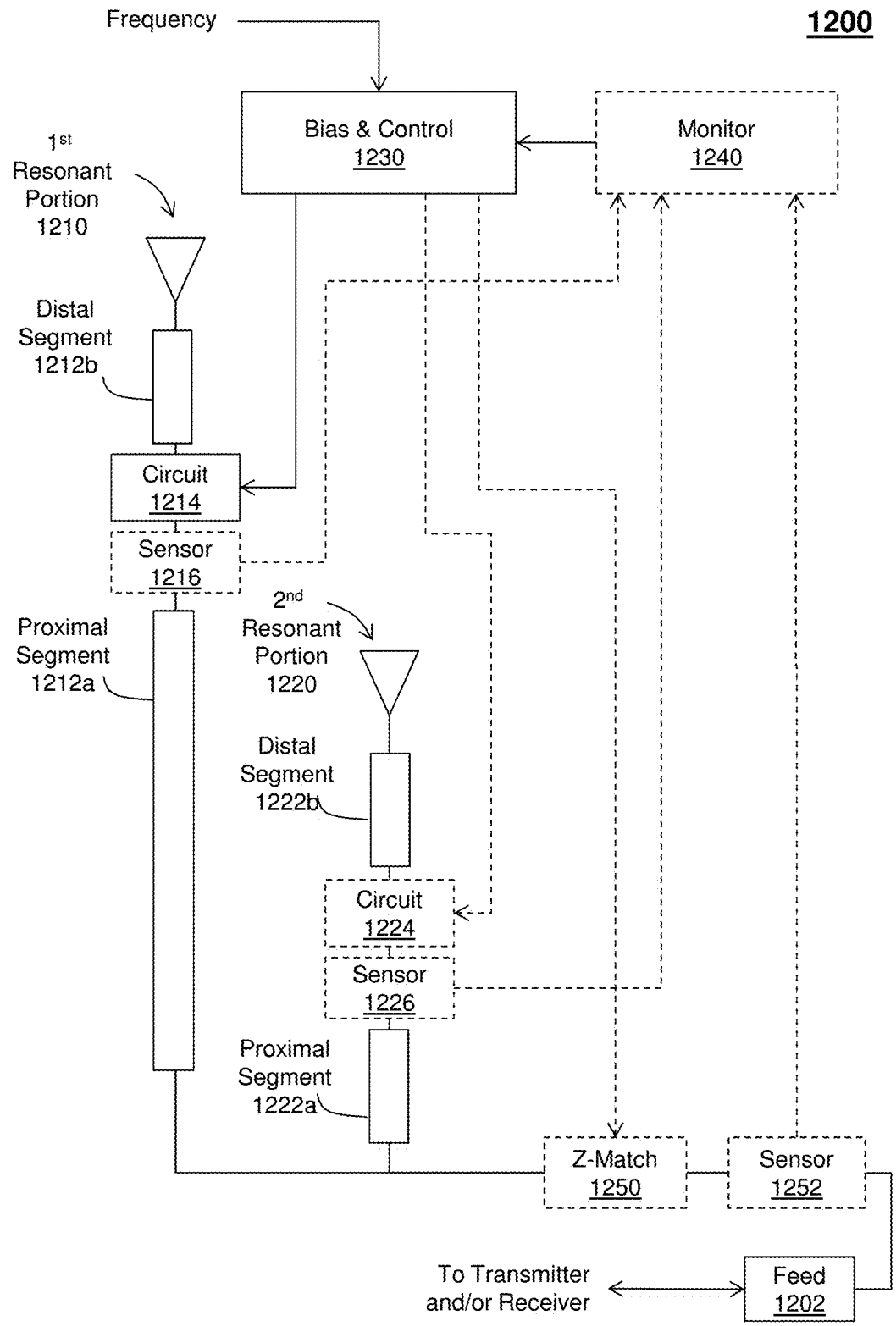
FIG. 12 depicts a schematic diagram of an illustrative embodiments of a dual-band, independently tunable antenna assembly.

FIG. 12 depicts a schematic diagram of an illustrative embodiment of a dual-band, independently tunable antenna assembly 1200. The tunable antenna assembly 1200 can include a common feed port 1202 coupled to each of a first resonant portion 1210 and a second resonant portion 1220. Each resonant portion 1210, 1220 of the antenna assembly 1200 can contribute to a respective different operational bandwidth, realizable, for example, at the common feed port 1202. For example, the first resonant portion 1210 contributes to a first operational bandwidth defined by favorable or desired performance within the first operational bandwidth. Such favorable performance can include, for example, a voltage standing wave ratio (VSWR) below a defined level, such as 2:1, or return loss below a certain level, such as 3 dB or 6 dB, within the first operational bandwidth. Likewise, the second resonant portion 1220 can contribute to a second operational bandwidth similarly defined by favorable or desired performance. In one embodiment, the first and second operational bandwidths can be substantially unrelated, such that a change to resonant performance of one of the first and second resonant portions 1210, 1220, as might be introduced by way of a tuning circuit 1214, described below, does not substantially affect or otherwise alter an operational bandwidth of the other resonant portion 1210, 1220.

In at least some embodiments, the first resonant portion 1210 includes at least two segments: a proximal segment 1212a and a distal segment 1212b. The proximal and distal segments 1212a, 1212b can be physically separated from each other, such that a direct current (DC) path does not exist between the two segments 1212a, 1212b. A tuning circuit 1214 can be electrically coupled between the proximal and distal segments 1212a, 1212b of the first resonant portion 1210. The proximal segment 1212a can extend between the feed port 1202 and the tuning circuit 1214. The distal segment 1212b is coupled at one end to the tuning circuit 1214, the other end extending away from the tuning circuit 1214.

The tuning circuit 1214, at least in part, can control electrical coupling between the proximal segment 1212a and the distal segment 1212b. For example, the tuning circuit 1214 can provide substantially high circuit impedance, e.g., an open circuit, between the two segments 1212a, 1212b, such that the distal segment 1212b is substantially disconnected or electrically isolated from the proximal segment 1212a. In such a configuration, resonance of the first resonant portion 1210 can be substantially defined by the physical and electrical features of the proximal segment 1212a. Considering each segment 1212a, 1212b as consisting of a linear conductor, resulting resonances occur at operational bandwidths at which the electrical length of the proximal segment 1212a approximates a quarter wavelength. Of course, the actual resonance and corresponding operational bandwidth will correspond to the nature of the antenna structure, according to well established principles of antenna design.

Alternatively, the tuning circuit 1214 can provide a substantially low circuit impedance (e.g., short circuit) between the two segments 1212a, 1212b, such that the distal segment 1212b is substantially electrically coupled to, and an extension of, the proximal segment 1212a. Once again, by way of example, considering linear arrangements, a resonance can be observed at operational bandwidths at which the electrical length of the combined proximal and distal segments 1212a, 1212b approximates a quarter wavelength. Providing different impedance values between open circuit and short circuit values by the tuning circuit 1214 can provide a selectable amount of coupling between the proximal and distal segments 1212a, 1212b, or otherwise alter resonant performance of the first resonant portion 1210 of the antenna assembly 1200. Such a capability of tuning the resonance of the first resonant portion 1210 using the tuning circuit 1214 allows for control of the operational bandwidth. Thus, an operational bandwidth of the antenna assembly 1200 can be extended by adjusting or otherwise controlling the tuning circuit 1214 disposed along the first resonant portion. The particular tuning value, e.g., open, short, or some other impedance value can be selected in response to an operational frequency, such that the operational frequency falls within an operational bandwidth of a suitably tuned resonant portion 1210.

Circuit topologies usable within any of the tuning circuits disclosed herein, include one or more of traditional topologies: series, shunt, pi, tee, bridge, lattice, Y, delta, ladder, combinations of one or more etc. Tuning circuits can be balanced or unbalanced, grounded or floating. Tuning circuits can include one or more switches, such as single-pole-single-throw (SPST) switches. In some embodiments, tuning circuits configured as an open circuit can be approximated by a circuit presenting a sufficiently high series impedance between adjacent proximal and distal segments. Such a circuit element can include a series capacitor of a suitable value to provide a relatively high reactive impedance (e.g., above 10 kΩ, above 100 kΩ or above 1MΩ) at the operational frequency band of interest, e.g., high-band and/or low-band. Similarly, tuning circuits configured as a short circuit can be approximated by a circuit presenting a sufficiently low series impedance between adjacent proximal and distal segments. Such a circuit element can also include a series capacitor of a suitable value to provide a relatively low reactive impedance (e.g., below 100Ω, below 10Ω, or below 1Ω) between the adjacent antenna segments. One or more variable reactive elements, such as variable capacitors can be incorporated into the tuning circuit to achieve such desired results. The exemplary embodiments can also include other configurations utilizing various electrical components, including capacitors, resistors, inductors and so forth.

In some embodiments, the second resonant portion 1220 can similarly include a proximal segment 1222a and a physically separate distal segment 1222b, with a second tuning circuit 1224 coupled between the two segments 1222a, 1222b. The configuration of the second resonant portion 1220, e.g., its shape, size, construction, can be selected to provide a corresponding operational bandwidth different than the first resonant portion 1210. The second tuning circuit 1224 can be controlled to alter or otherwise adjust the second operational bandwidth, for example, extending a range of the second operational bandwidth. The second tuning circuit 1224 is optional, shown in phantom, and can be left out altogether. For embodiments of the second resonant portion 1220 that do not include the second tuning circuit 1224, the proximal and distal segments 1220a, 1220b can be adjoining, or otherwise arranged as a single contiguous segment, without any separation. It is understood that additional resonant portions (not shown) can be provided, each driven by the common feed port 1202 and providing a respective operational bandwidth different from any other resonant portions driven by the same feed port 1202. Such other resonant portions can be tunable or not.

In some embodiments, one or more of the tuning circuits 1214, 1224 can be fixed or otherwise non-tunable. In other embodiments, one or more of the tuning circuits 1214, 1224 can be tunable, for example, according to the various tuning arrangements disclosed herein. For such tunable embodiments, a controller 1230 can be included as part of the antenna assembly 1200 as shown, or provided separate from the antenna assembly, but in electrical communication with the one or more tuning circuits 1214, 1224 of the antenna assembly 1200. The control circuit 1230 is configured to provide a suitable control signal, respectively, to each of the one or more tuning circuits 1214, 1224. The control signals adjust the corresponding circuit configuration to achieve a desired operational bandwidth. To the extent that any of the tuning circuits 1214, 1224 require biasing, e.g., one or more DC voltages, the control circuit can be configured as a bias and control circuit 1230 to also provide such biasing. Alternatively or in addition, such biasing can be provided separately from the controller 1230.

By way of illustrative example, the controller 1230 can receive an indication of an operational bandwidth. As illustrated, the controller 1230 can receive an indication of one or more frequencies, such as an assigned frequency for cellular operation as might be assigned by way of a local cell tower. Alternatively or in addition, the assigned frequency can be determined by selection of an operational feature of the corresponding communication device, e.g., selecting a channel or operating in a particular mode, such as WiFi. The controller 1230 can determine which of the multiple operational bands should serve the frequency request, e.g., either a low-band or a high-band of a dual band antenna assembly, as in the illustrative example. Once the appropriate band of such a multi-band antenna assembly has been determined, the controller can next determine a configuration of the corresponding tuning circuit 1214, 1224 that results in an acceptable performance at the assigned frequency, e.g., as measured by VSWR, return loss or other parameters, such as efficiency. The tuning process can be repeated, as necessary, for other operational bands of a multi-band device, or in response to assignment of a different frequency within the same band.

In some embodiments, one or more of the tuning circuits 1214, 1224 can be operated in an "open loop" configuration. Such open-loop operation can include a lookup table, such as the example lookup table shown in FIG. 7. The lookup table can be determined beforehand, for example, by one or more of analytical or experimental techniques. For example, the lookup table can include an association between one or more frequencies or frequency bands and corresponding tuning circuit control signal, resulting in a tuning circuit configuration that provides acceptable antenna performance, e.g., resonance, within a vicinity of the assigned frequency. Thus, in response to receiving an assigned frequency, the controller 1230 consults the lookup table, and identifies from the lookup table a corresponding tuning circuit configuration, or control signal to achieve the corresponding tuning circuit configuration. The controller 1230 can then provide the tuning circuit control signal obtained using the lookup table to the corresponding tuning circuit 1214, 1224 to adjust resonance of the corresponding resonant portion 1210, 1220 of the antenna assembly 1200. Alternatively or in addition, such tuning by lookup table can include additional provisions to account for one or more the physical and functional configurations, for example, as described in relation to FIGS. 7 and 8.

Alternatively or in addition, one or more of the tuning circuits 1214, 1224 can be operated in a "closed loop" configuration. Such closed-loop operation includes monitoring of a feedback signal indicative of performance of the corresponding resonant portion 1210, 1220. As illustrated, one or more of the resonant portions 1210, 1220 can include a respective sensor 1216, 1226, such as directional couplers, voltage dividers, or other suitable sensing technologies. Each sensor 1216, 1226 can be positioned at a suitable position of the antenna assembly 1200. For example, the sensors 1216, 1226 can be positioned along one of the corresponding proximal or distal segments 1212a, 1212b, 1222a, 1222b, or between adjacent segments, as shown. Other suitable locations might include closer to the common feed port 1202, or even external and connected to the feed port 1202. Each of the sensors 1216, 1226 can be coupled to a monitor circuit 1240, as shown, or directly to the controller 1230.

Whether by the monitor circuit 1240 or directly from the sensor 1216, 1226, the controller receives an indication of the operational bandwidth performance within the vicinity of the assigned one or more frequencies. The controller 1230 can adjust the respective tuning circuit 1214, 1224 associated with the corresponding sensor 1216, 1226, monitor the performance, and further adjust the tuning circuit 1214, 1224 to improve performance or otherwise retain performance within an acceptable tolerance prior to or during operation. It is understood that well established feedback control techniques can be applied to such closed loop circuits and techniques.

In at least some embodiments, a lookup table can be used in combination with such closed loop techniques. For example, a lookup table can provide an initial tuning control signal give one or more of an assigned frequency, and/or physical and functional configurations of the associated communications device. The exemplary embodiments can also include the use of various combinations of open looped and closed loop tuning, including nesting of open and/or closed loop tuning.

As shown, the antenna assembly 1200 can optionally include a matching or common tuning network 1250 (shown in phantom). The matching network 1250 can be disposed along a common portion of the antenna assembly 1200 shared by all of the two or more resonant portions 1210, 1220, such as near the antenna feed port 1202, as shown. Thus, the matching network 1250 can simultaneously alter performance of each of the two or more resonant portions 1210, 1220. Such a matching network 1250 can be controlled by the same controller 1230, or a separate controller (not shown).

The controller 1230 can operate according to the various open or closed loop techniques disclosed herein. For closed loop techniques, a sensor 1252 can be provided in relation to the matching network 1250. The sensor 1252 can include one or more of directional couplers, voltage dividers, or other suitable sensing technologies, such as those disclosed herein. The sensor 1252 can provide an indication of matched performance to the monitor 1240 or directly to the controller 1230, for example, as described above in relation to the sensors 1216, 1226 of the individual resonant portions 1210, 1220. The controller 1230 can implement one or more tuning algorithms that work independently, for example, adjusting the matching network 1250 without regard to the tuning circuits 1214, 1224. Alternatively or in addition, the controller 1230 can implement cooperative tuning algorithms, for example, first adjusting the matching network 1250, then adjusting each of the one or more tuning circuits 1214, 1224, in turn, perhaps repeating such adjustments periodically to achieve further refinements in operation and/or to respond to changes encountered to operational performance.

Figure 13:
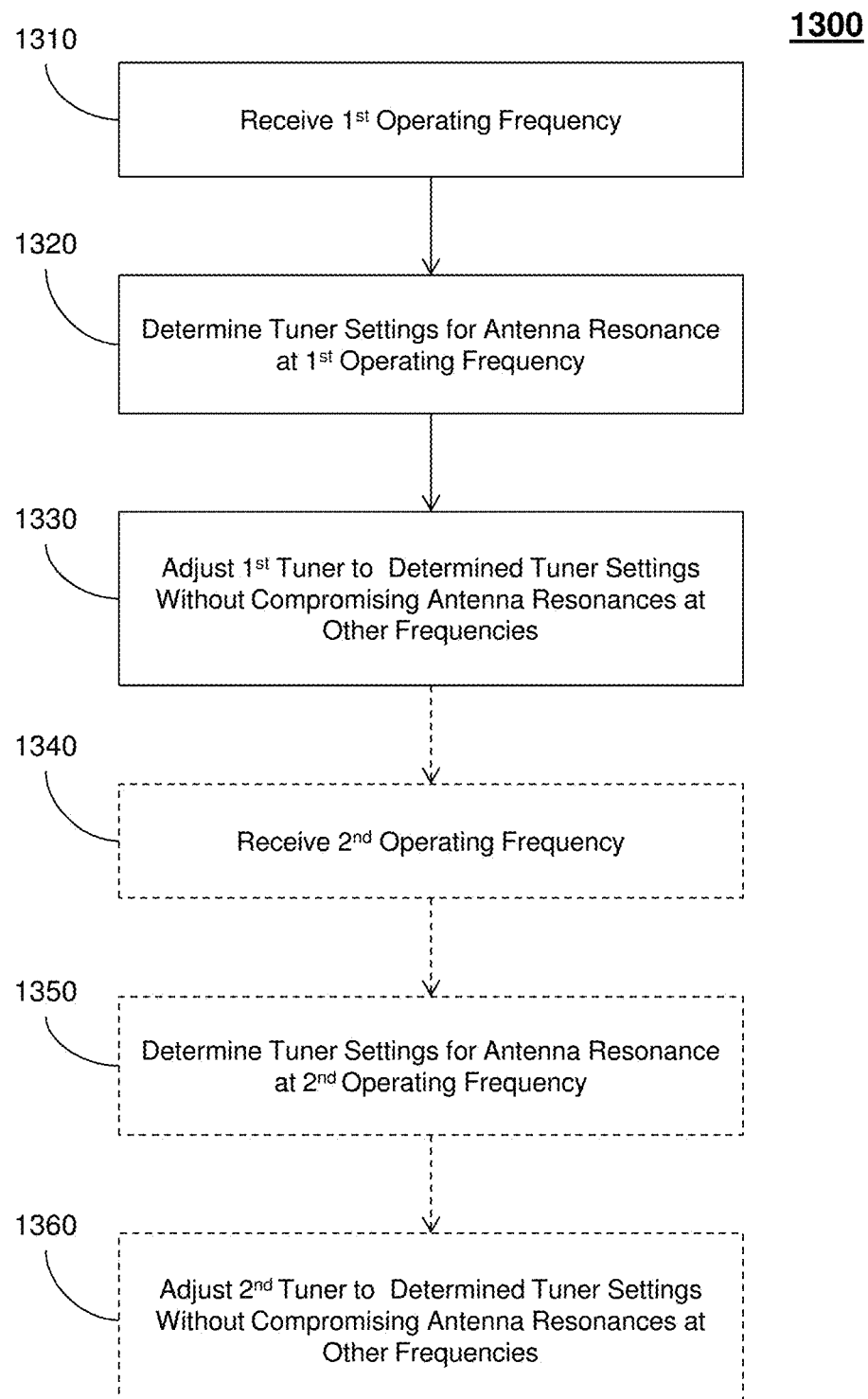
FIG. 13 depicts illustrative embodiments of a process for tuning a dual-band, independently tunable antenna assembly.

FIG. 13 depicts an illustrative embodiment of an antenna tuning process 1300 that operates in portions of the devices of FIGS. 1-12. The process 1300 can begin at 1310 in which a first operating frequency is received or otherwise accessed, for example by a controller 1230 (FIG. 12). A tuner setting can be determined at 1320, responsive to the first operating frequency. In one embodiment, the tuner setting can be determined by the controller 1230 to result in a resonance of the antenna assembly within the vicinity of the first operating frequency. A tuning circuit, such as the first tuning circuit 1214 (FIG. 12), can be adjusted to attain the desired resonance performance at 1330. Preferably, such adjustment of the resonance performance responsive to the received first operating frequency is achieved without compromising resonance performance at other operating bandwidths of a multiband antenna assembly 1200. In one embodiment, the controller 1230 can provide a control signal to the corresponding tuning circuit 1214 to adjust resonant performance of the associated resonant portion 1210. The tuning circuit 1214 can reconfigure itself in response to the command received from the controller 1230. Adjustment of the tuning circuit 1214 can change a circuit property of the associated resonant portion 1210, such as a reactance, thereby altering a corresponding resonance of the first resonant portion. Such control can be accomplished in an open loop and/or closed loop manner, according to the various tuning techniques disclosed herein and otherwise known to those skilled in the art of automated equipment control.

In some embodiments, the process can be repeated as in steps 1340, 1350 and 1360, shown in phantom. Thus, at 1340 a second operating frequency can be received, for example by the controller 1230. A corresponding setting of a second tuning circuit 1224 can be determined at 1350, responsive to the received second operating frequency. In a similar manner, the tuner setting can be determined by the controller 1230 to attain a resonance of the antenna assembly 1200 within the vicinity of the second operating frequency. A tuning circuit, such as the second tuning circuit 1224 (FIG. 12) can be adjusted to attain the desired resonance performance at 1360. The process of steps 1340 through 1360 can be repeated to achieve tuning of additional resonant portions of the same antenna assembly. Alternatively or in addition, one or more of steps 1310-1330 and 1340-1360 can be repeated, as required, according to receipt of updated first and/or second operating frequencies.

Figure 14:
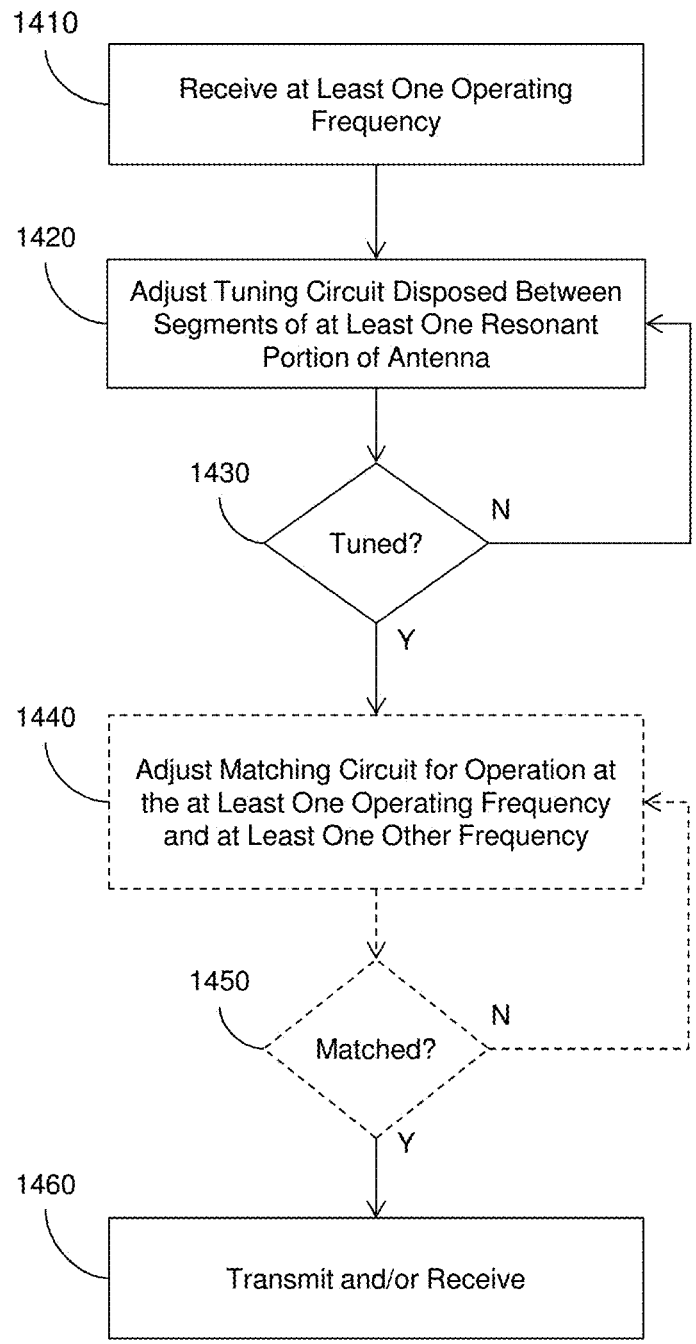
FIG. 14 depicts illustrative embodiments of a process for operating a dual-band, independently tunable antenna assembly.

FIG. 14 depicts an illustrative embodiment of another antenna tuning process 1400 that operates in portions of the devices of FIGS. 1-12. The process 1400 can begin at 1410 in which at least one operating frequency is received or otherwise obtained. For example, a controller 1230 as in FIG. 12 can receive an operating frequency. At 1420, a tuning circuit can be adjusted in response to the received operating frequency. For example, a tuning circuit 1214, 1224, as in FIG. 12, can be instructed by the controller 1230 to adjust its configuration responsive to the at least one operating frequency. At 1430, a determination can be made as to whether the adjusted tuning circuit has resulted in tuning of a corresponding resonant portion, e.g., the first resonant portion 1210, as in FIG. 12. Upon a determination that the resonant portion 1210 has not been tuned, further adjustment of the tuning circuit 1214 can be performed back at 1420. The process can repeat as necessary until it has been determined at 1430 that the resonant portion 1210 has been tuned.

In at least some embodiments, determination as to whether the antenna has been tuned at 1430 can be accomplished at least in part using a sensor 1216, as in FIG. 12. The sensor 1216 can provide feedback that can be used to arrive at a determination as to whether the first resonant portion 1210 is sufficiently tuned. It is understood that in at least some embodiments, a test signal can be injected into the antenna assembly 1200, e.g., through the antenna port 1202, to provide any of the feedback signals disclosed herein. Alternatively or in addition, an external signal, e.g., received by the antenna assembly 1200, can serve as a means for producing such feedback. Such external signals can be provided, for example, by a test source, by a signal of opportunity, or by a target received signal, e.g., at or near the at least one operating frequency.

Once the first resonant portion 1210 of the antenna assembly has been sufficiently tuned, as determined at 1430, the antenna assembly 1200 can be used to receive and/or transmit at 1460. In at least some embodiments, the antenna tuning process 1400 includes provisions for further adjusting an antenna matching network, such as the matching network 1250 shown in FIG. 12. For example, at 1440 (shown in phantom), a matching circuit 1250 is adjusted for operation at the at least one operating frequency and at least one other operational frequency in a different operational frequency band of the multiband antenna assembly. Such a common matching can represent a compromise considering operation within multiple operating bands, such that the match is not optimized for any one operational frequency band, although, in some embodiments, a preferred match to one of the multiple operational bands can be achieved, at least temporarily.

In at least some embodiments, determination as to whether the antenna has been matched at 1440 can be accomplished at least in part using a sensor 1252, as in FIG. 12. The sensor 1252 can provide feedback that can be used to arrive at a determination as to whether the antenna assembly 1200 is sufficiently matched. At 1450 (also shown in phantom), a determination is made as to whether the adjusted matching network 1250 has resulted in a sufficient match. Upon a determination that the antenna assembly 1200 has not been sufficiently matched, further adjustment of the matching circuit 1250 can be performed at 1440. The process can repeat as necessary until it has been determined at 1450 that the antenna assembly has been sufficiently matched. Once the resonant portion 1210 of the antenna assembly has been sufficiently tuned, as determined at 1430, and the antenna assembly 1200 has been sufficiently matched, the antenna assembly 1200 can be used to receive and/or transmit at 1460. In one or more embodiments, acts described with respect to process 1300 can be used with acts described with respect to process 1400.

Figure 15:
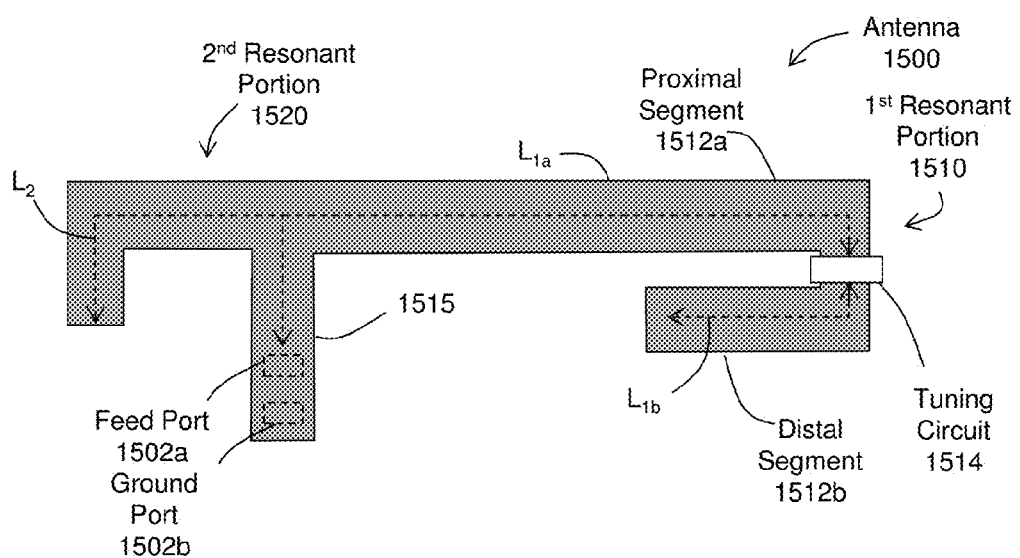
FIG. 15 depicts a planar view of an embodiment of a dual-band, independently tunable antenna assembly.

FIG. 15 depicts a planar view of an illustrative embodiment of a dual-band, independently tunable antenna assembly 1500, called a planar inverted "F" antenna (PIFA) 1500. The antenna assembly 1500 can include a common feed port 1502a, through which a signal source and/or a signal receiver can be interconnected to the antenna assembly 1500. The feed port 1502a can include a first contact location or point along a portion of the antenna 1500, as shown. In at least some embodiments, the antenna feed can include a second feed port 1502b also including a respective contact location or point along another portion of the antenna, as driving two halves of a balanced antenna structure (e.g., a dipole antenna, not shown). Alternatively or in addition, the second contact location of the feed port 1502b can be connected to a ground reference, including a radio frequency (RF) ground. In the illustrative embodiment, the second feed port 1502b includes such a ground port 1502b. Although referred to as being grounded, there is no requirement that the second feed port 1502b be grounded. Reference to a ground port can simply indicate a feed port to which a grounded interconnection can be made (e.g., to a shield of a coaxial cable connected to a transmitter and/or a receiver).

The antenna assembly 1500 can also include a first resonant portion 1510 and a second resonant portion 1520. Each resonant portion 1510, 1520 can be in electrical communication with the common feed port 1502a and ground port 1502b. In the illustrative example, the first resonant portion 1510 can extend away from a common section or segment 1515 of the antenna adjacent to the feed port 1502a. The second resonant portion 1520 can extend away from the common section 1515, along a different, non-overlapping direction. The first resonant portion 1510 can be divided into two segments: a proximal segment 1512a coupled at one end to the common section 1515 and a distal segment 1512b physically separated from the proximal segment 1512a. In the illustrative embodiment, an isolating gap is formed between adjacent proximal and distal segments 1512a, 1512b, each extending in opposite directions away from the gap.

A tuning circuit 1514 can be coupled between the adjacent proximal and distal segments 1512a, 1512b, for example, bridging the gap formed therebetween. In at least some embodiments, the tuning circuit 1514 can be configurable, such that configuration of the tuning circuit 1514 alters a corresponding resonance of the associated resonant portion 1510. The second resonant portion 1520 has a length $L_2$ measured from a common reference. The first resonant portion 1510 has a length ($L_1$) determined as the sum of the lengths of the proximal segment ($L_{1a}$) and the distal segment 1512b ($L_{1b}$). In the illustrative embodiment, the length of the first segment (i.e., $L_{1a}+L_{1b}$) can be greater than the length $L_2$ of the second resonant portion 1520, such that each resonant portion 1510, 1520 exhibits a respective resonance at a different portion of the electromagnetic spectrum.

In the illustrative embodiment, a resonance of first resonant portion 1510 can be adjusted to some degree by reconfiguration of the tuning circuit 1514; whereas, a resonance of the second resonant portion 1520 can be fixed or substantially fixed, as determined by the configuration of the antenna assembly, e.g., the length $L_2$ of the second resonant portion 1520. Preferably, adjustment of the tuning circuit 1514 can change a resonance of (i.e., tunes) the first resonant portion 1510, without substantially affecting the resonance of the second resonant portion 1520.

Figure 17A:
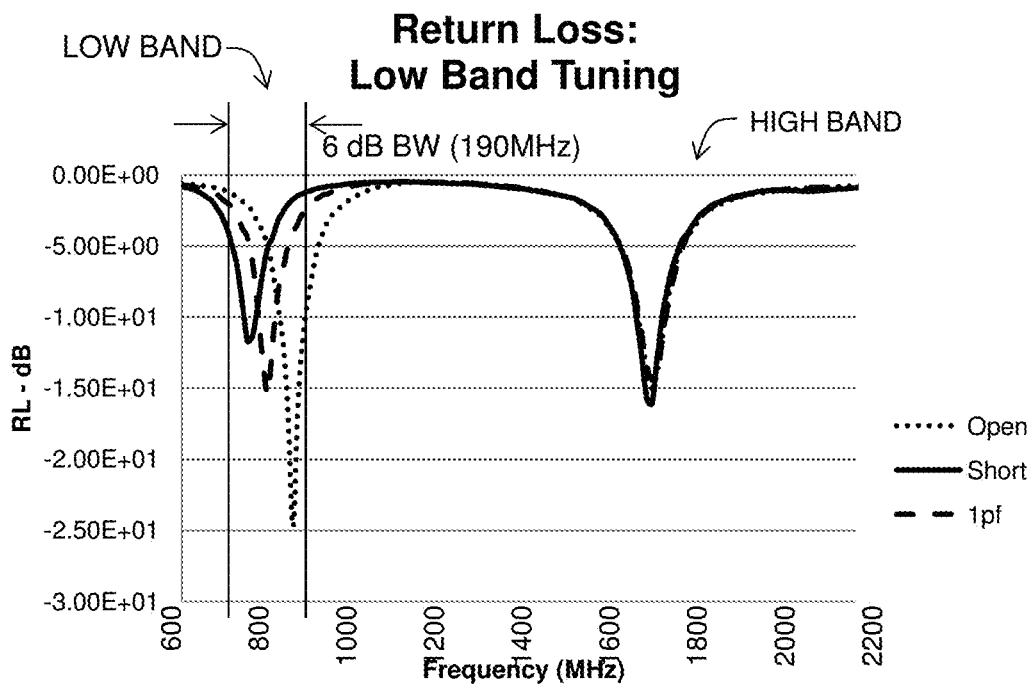
FIGS. 17A-17D depict graphical representations of performance of an illustrative embodiment of a dual-band, independently tunable antenna element.

An example of the resonant performance is illustrated in the return loss plots shown in FIG. 17A. A "low-band" resonance associated with the first resonant portion 1510 is shown for three example configurations of the tuning circuit 1514. In a first configuration the tuning circuit 1514 is an open circuit. In this configuration, the distal segment 1512b is substantially isolated from the proximal segment 1512a by the gap (open circuit). In this configuration, the resonance performance of the first resonant portion 1510 corresponds substantially to the length $L_{1a}$ of the proximal segment 1512a, which remains coupled to the common feed port 1502. Accordingly, the first resonant portion 1510 is relatively short, exhibiting a resonance at a higher frequency, yet still within the low-band. In the example embodiment, the center frequency $f_c$ of the open-circuit resonance is located at about 950 MHz.

In a second configuration the tuning circuit 1514 is a short circuit. In this configuration, the distal segment 1512b is substantially an extension of the proximal segment 1512a, with a resonance corresponding to the length $L_1=L_{1a}+L_{1b}$ of the combined proximal segment 1512a and distal segment 1512b. Accordingly, the first resonant portion 1510 is relatively long, exhibiting a resonance at a lower frequency, yet still within the low band. A center frequency $f_c$ of the short-circuit resonance is located at about 780 MHz. In a third configuration the tuning circuit 1514 is a series capacitance of about 1 picofarad coupled in series between the proximal segment 1512a and the distal segment 1512b. The series reactance of the capacitive tuning circuit 1514 configuration results in a center frequency $f_c$ somewhere in between the resonances of the open-circuit and short-circuit configurations, at about 810 MHz.

As illustrated, each resonance is identifiable by a relatively low return loss, indicating that less energy is reflected from the antenna feed port 1502 within the vicinity of the resonant frequency $f_c$. A 6 dB value of return loss represents a reflection coefficient of about 0.5, or 50%. An operational bandwidth of each resonance can be defined according to a value of return loss, such as a 6 dB bandwidth. Such a bandwidth corresponds to the range of frequencies extending between the locations on either side of the center frequency $f_c$, at which the return loss has increased to 6 dB. As can be observed from the plot, the 6 dB bandwidth at each tuning can be used to extend a 6 dB bandwidth of the antenna assembly 1500, by reconfigurations of the tuning circuit 1514 a disclosed herein. Thus, a 6 dB bandwidth can be extended from about 760 MHz to about 950 MHz, which is much greater than a 6 dB bandwidth at any of the individual tuned configurations.

The upper boundary of this range can be controlled at least to some degree by a length of the proximal segment 1512a; whereas, a lower boundary of this range can be controlled at least to some degree by a combined length of the proximal segment 1512a and the distal segment 1512b. A minimum number of tuning circuit configurations can be determined, as required, to provide a 6 dB bandwidth between the upper and lower limits. It is important to recognize the existence of a second resonance at about 1750 MHz resulting from the second resonant portion 1520. In particular, it is important to recognize that the center frequency fc of the second resonance and the 6 dB bandwidth performance remain substantially unchanged or otherwise unaffected by reconfigurations of the first resonant portion 1510.

Figure 17B:
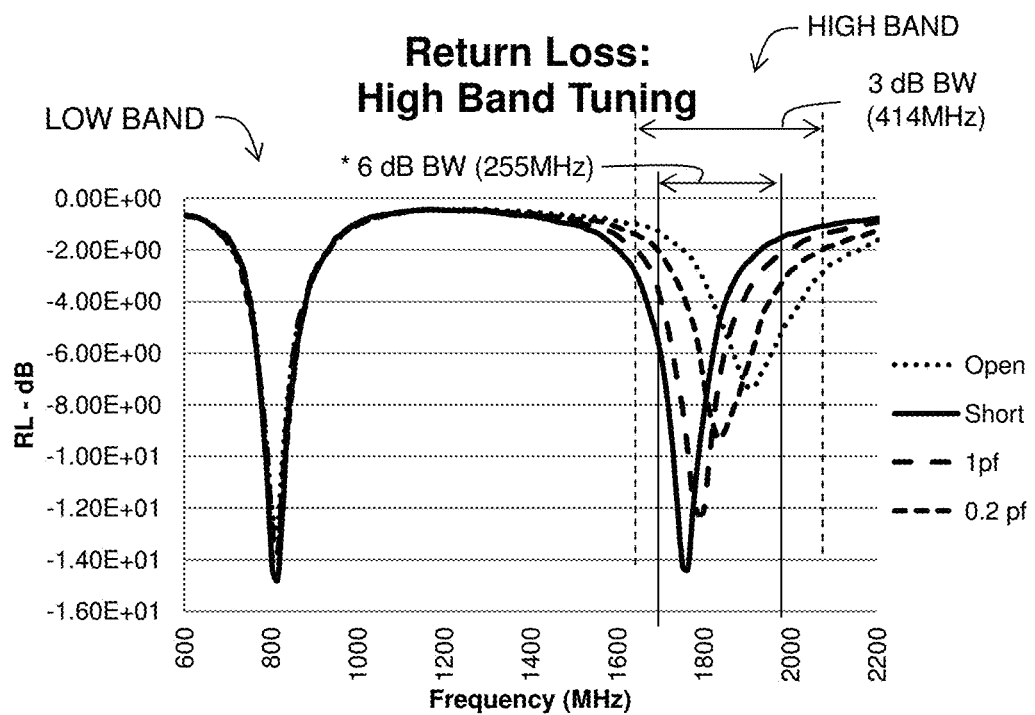
Figure 17C:
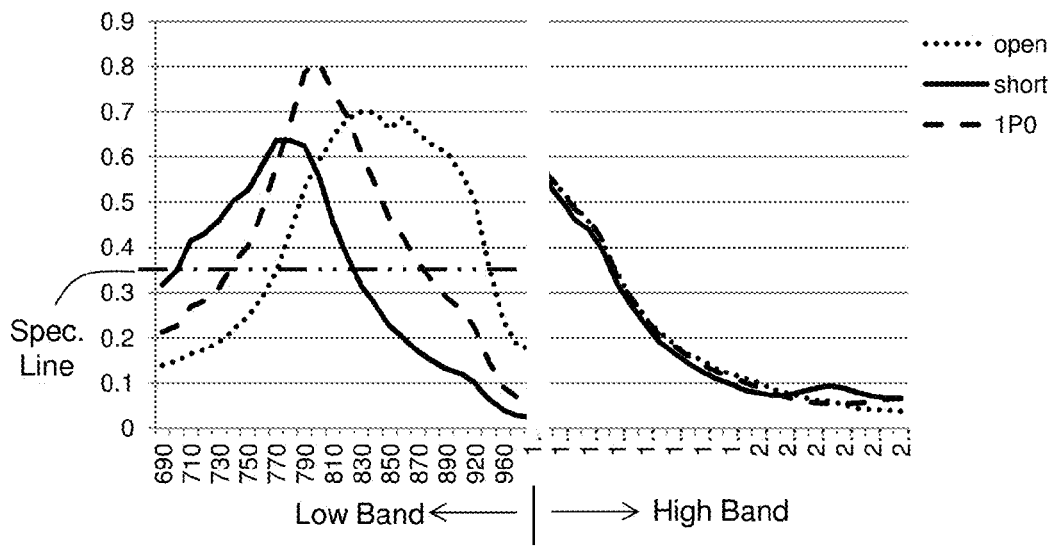

An illustration of the efficiency performance of the antenna assembly 1500 is provided in the plot of FIG. 17C, for low-band tuning. A measure of antenna efficiency under the various configurations of the first tuning circuit 1514 is shown for the low band. As can be seen, desirable efficiency performance (e.g., above some specified value, such as 33%), can be extended by varying the configuration of the first tuning circuit 1524, depending upon the particular operating frequency. As with the return loss, reconfiguration of the first tuning circuit 1514 does not substantially affect efficiency performance at the high-band associated with the second resonant portion 1520.

Figure 16:
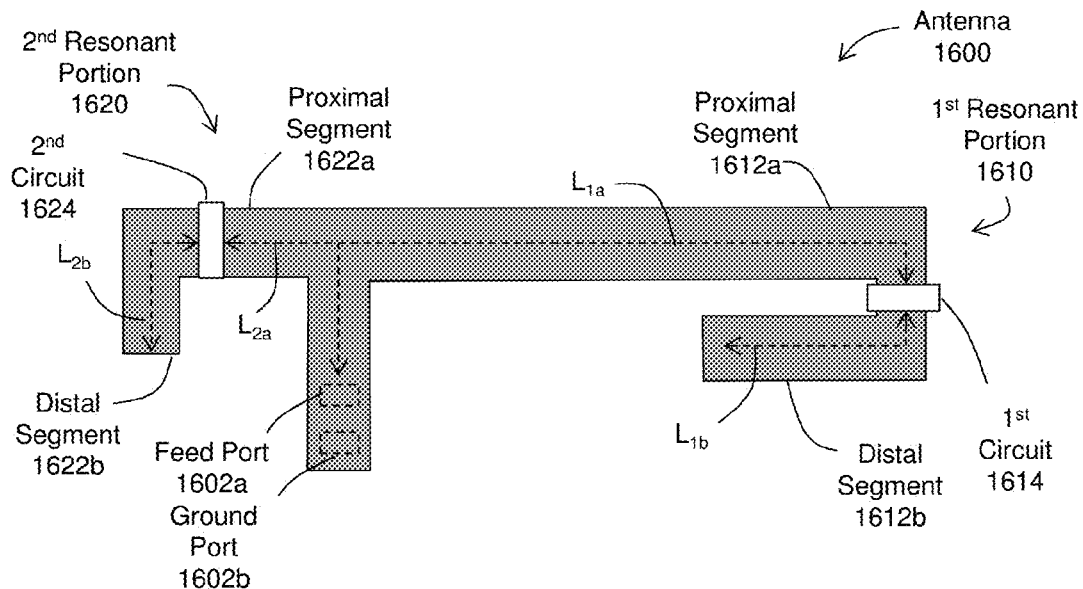
FIG. 16 depicts a planar view of another embodiment of a dual-band, independently tunable antenna assembly.

FIG. 16 depicts a planar view of another embodiment of a dual-band, independently tunable antenna assembly 1600 having first and second resonant portions 1610, 1620, each coupled to a common feed port 1602a and a common ground port 1602b. The first resonant portion 1610 includes a proximal segment 1612a adjacent to and separated from a distal segment 1612b. A first tuning circuit 1614 is coupled between the proximal segment 1612a and the distal segment 1612b. Likewise, the second resonant portion 1620 includes a proximal segment 1622a adjacent to and separated from a distal segment 1622b. A second tuning circuit 1624 is coupled between the proximal segment 1622a and the distal segment 1622b.

Resonant performance of the low-band resonant portion 1610 can be similar to the low-band resonant performance described in relation to the antenna assembly 1500. Referring next to FIG. 17B, resonant performance of the second resonant portion, corresponding to high-band operation, is illustrated for four different configurations: an open circuit, having a center frequency $f_c$ of about 1925 MHz; a series connected 0.2 picofarad capacitor, having a center frequency $f_c$ of about 1850 MHz; a series connected 1 picofarad capacitor, having a center frequency $f_c$ of about 1800 MHz; and a short circuit, having a center frequency $f_c$ of about 1750 MHz. The four configurations provide a 6 dB bandwidth of about 255 MHz and a 3 dB bandwidth of about 414 MHz. Once again, it is important to recognize the existence of a second, low band resonance at about 800 MHz resulting from the first resonant portion 1610. In particular, it is important to recognize that the center frequency $f_c$ of the first resonance and the 6 dB bandwidth performance remain substantially unchanged or otherwise unaffected by reconfigurations of the tuning circuit 1624 of the second resonant portion 1620.

Figure 17D:
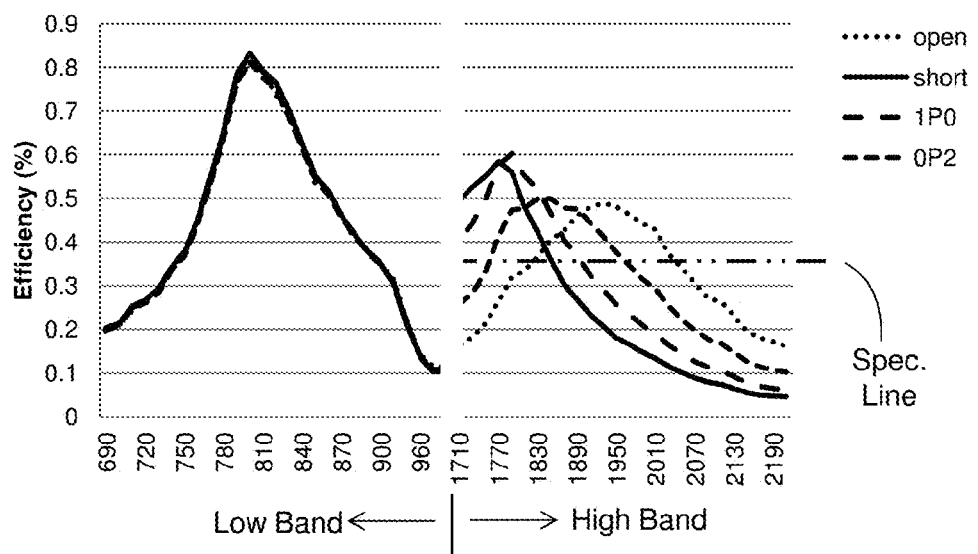

An illustration of the antenna assembly efficiency is provided in the plot of FIG. 17D, for high-band tuning. A measure of antenna efficiency under the various configurations of the second tuning circuit 1624 is shown for the high band. As can be seen, desirable efficiency performance (e.g., above some specified value, such as 33%), can be extended by varying the configuration of the second tuning circuit 1624, depending upon the particular operating frequency. As with the return loss, reconfiguration of the second tuning circuit 1624 does not substantially affect efficiency performance at the low-band associated with the first resonant portion 1610.

In some embodiments, tunable portions of a multi-band tunable antenna assembly can be formed from electrical conductors. The electrical conductors can be structurally self supportive, as in wire antennas. Alternatively or in addition, the electrical conductors can be supported, at least in part, by a non-conducting substrate. For example, one or more conductive portions of any of the antenna assemblies disclosed herein can be formed with relatively thin metallic leaf radiating elements supported by rigid, semi-rigid or flexible non-conducting substrates. Such metallic leaf elements can include electrical conductors, such as copper, silver, gold, aluminum, and other conductors, including metal alloys. Substrates include flexible plastic substrates, including but not limited to polyester, polyimide, polyether ether ketone (PEEK), allowing the board to conform to a desired shape, or to flex during use. Alternatively or in addition, substrates can include a more rigid, e.g., glass epoxy substrate, such as FR-4 grade, or other grades (e.g., G-10, G-11, FR-5).

Conductive antenna elements can be applied to one or more such non-conducting substrates by application of a conductive foil, a conductive chemical deposition, e.g., chemical vapor deposition or sputtering, electroplating, screen printed bonding, or any other suitable method for attaching one or more conductive layers to a non-conducting substrate. Other techniques for forming flexible circuits include laminating thin (e.g., 0.1 mm or less) conductive strips on or in-between layers of a flexible, non-conductive substrate, such as polyethylene terephthalate (PET).

In some embodiments, such as those embodiments in which the conductive elements are formed as leaf conductors, attachment to one or more of the tuning elements can be challenging. For example, one or more conductive portions of any of the antenna assemblies disclosed herein can be formed on a flexible circuit or another substrate, such as a housing or other structural component of a communications device, e.g., a cover of a cell phone. Any need for interconnections to other circuit elements, such as bias and control circuitry, for conductors formed on such flexible, or structural, traditionally non circuit bearing elements presents similar challenges of attachment, interconnection and signal routing.

Figure 18A:
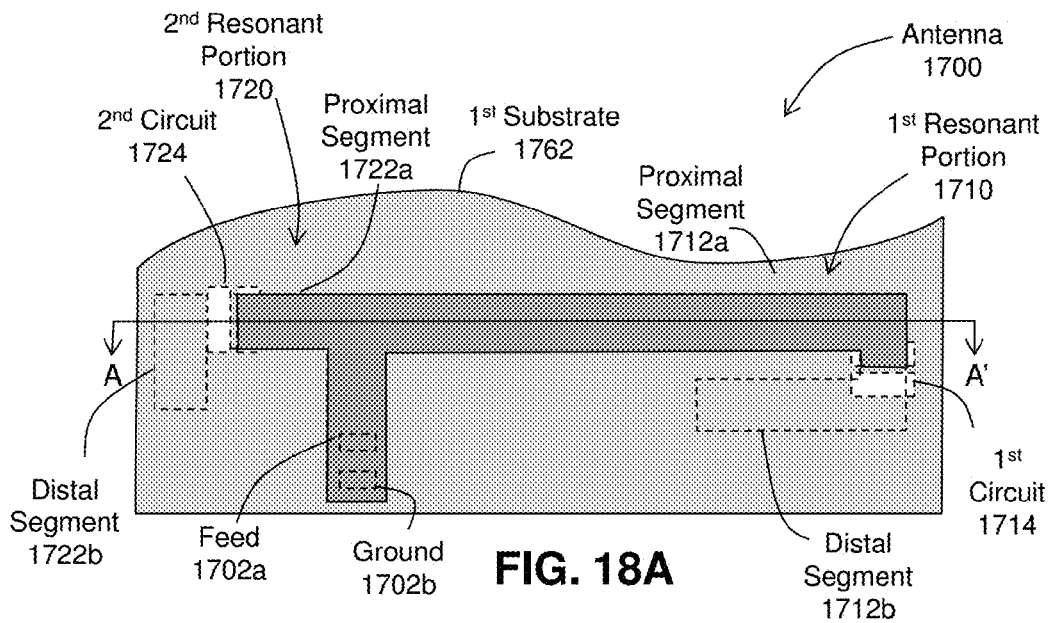
Figure 18C:
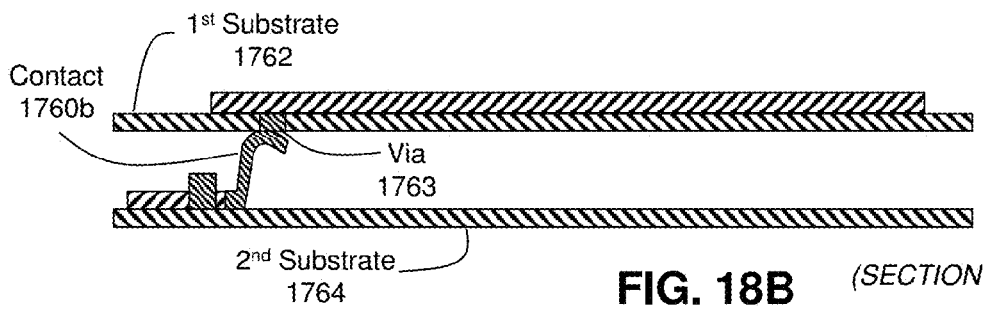
Figure 18C:
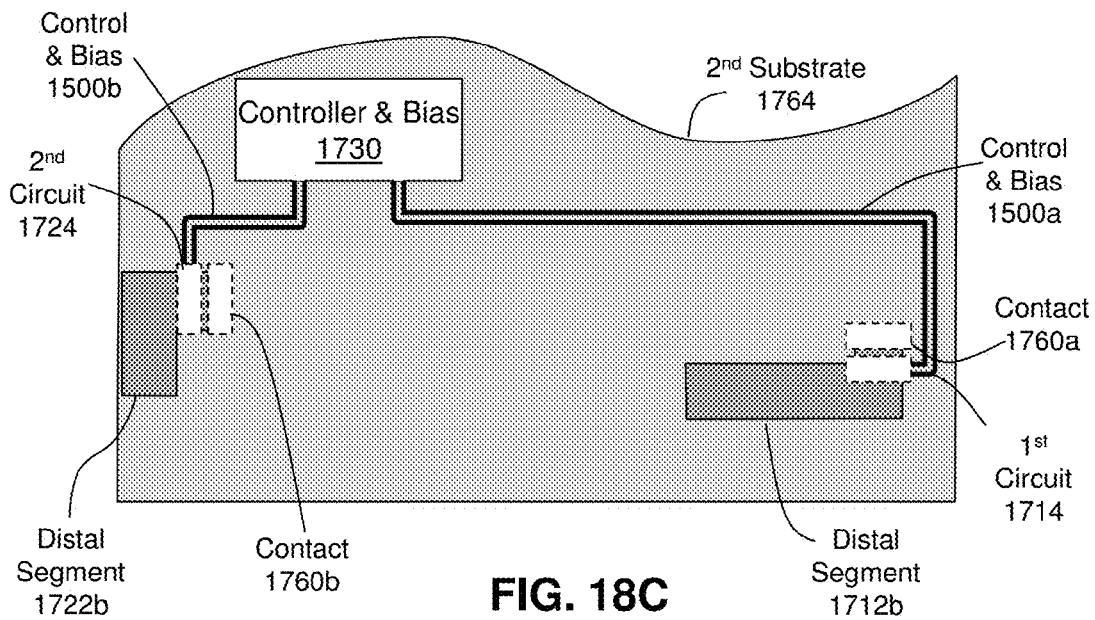

FIGS. 18A-18C depict planar and sectional views of a portion of a circuit assembly including dual-band, independently tunable antenna assembly 1700, adapted to facilitate inclusion of tuning elements along resonant portions of metallic leaf antenna segments. Once again, the multi-band tunable antenna assembly 1700 includes a first resonant portion 1710 and a second resonant portion 1720, each in electrical communication with a common feed port 1702. The first resonant portion 1710 include a proximal segment 1712a coupled to the feed port 1702a and a ground port 1702b, and a distal segment 1712b coupled to the proximal segment 1712a through a first tuning circuit 1714. Likewise, the second resonant portion 1720 include a proximal segment 1722a coupled to the common feed port 1702a and ground port 1702b, and a distal segment 1722b coupled to the proximal segment 1722a through a second tuning circuit 1724.

The proximal segments 1712a, 1722a of each of the first and second resonant portions 1710, 1720 as well as any common conducting portions and the common feed port 1702a and ground port 1702b, are provided as a relatively thin or leaf conductor structure supported upon a first non-conducting substrate 1762, having a dielectric constant conducive to operation in the intended frequency range, e.g., low loss. The distal segments 1712b, 1722b of the first and second resonant portions 1710, 1720 are also provided as relatively thin or leaf conductor structures, however, these structures are supported on a second substrate 1764, also having a dielectric constant conducive to operation in the intended frequency range, e.g., low loss. The first and second substrates 1762, 1764 can be substantially planar and arranged in at least a partially overlapping manner, such that the distal segments 1712b, 1722b are aligned with the proximal segments 1712a, 1722a as illustrated in FIG. 18A. Electrical contacts 1760a, 1760b can be provided between the first and second substrates 1762, 1764 within the vicinity of overlapping ends of the first and second segments 1712a, 1722a, 1712b, 1722b to provide electrical continuity therebetween. The first and second tuning circuits 1714, 1724 can be positioned on one of the substrates 1762, 1764, such as the second substrate 1764, as shown. In this configuration, a gap between the proximal and distal segments 1712a, 1722a, 1712b, 1722b is disposed on the second substrate 1764, between the electrical contact 1760a, 1760b and the extending second segment 1712b, 1722b. As also illustrated, related circuitry, such as the controller and bias module 1730 can be located on the second substrate 1764, together with the first and second tuning circuits 1714, 1724.

In some embodiments, the first substrate 1762 corresponds to a non-conducting cover of a communications device, such as device 100 in FIG. 1. As such, the conductive portions can be located along a surface of the substrate 1762 facing the second substrate 1764. Thus, vias 1763 would not be necessary. The second substrate 1764 can represent a portion of a printed circuit board of the communications device 100, facilitating access to power, control for the first and second tuning circuits 1714, 1724. Preferably, the printed circuit board 1764 is free from any electrical ground plane at least within the vicinity of overlap with other portions of the antenna assembly.

Upon reviewing the aforementioned embodiments, it would be evident to an artisan with ordinary skill in the art that said embodiments can be modified, reduced, or enhanced without departing from the scope of the claims described below. For example, other configurations and combinations, including different arrangement of the various components between the different substrates 1762, 1764 are within the scope of the disclosure. For example, the distal segments can also be provided on the first substrate 1762, also including second contacts, such that the first and second tuning circuits 1714, 1724 can remain on the circuit board, while substantially all of the antenna segments can reside on the first substrate 1762.

Other embodiments can be applied to the subject disclosure without departing from the scope of the claims described below.

It should be understood that devices described in the exemplary embodiments can be in communication with each other via various wireless and/or wired methodologies. The methodologies can be links that are described as coupled, connected and so forth, which can include unidirectional and/or bidirectional communication over wireless paths and/or wired paths that utilize one or more of various protocols or methodologies, where the coupling and/or connection can be direct (e.g., no intervening processing device) and/or indirect (e.g., an intermediary processing device such as a router).

Figure 19:
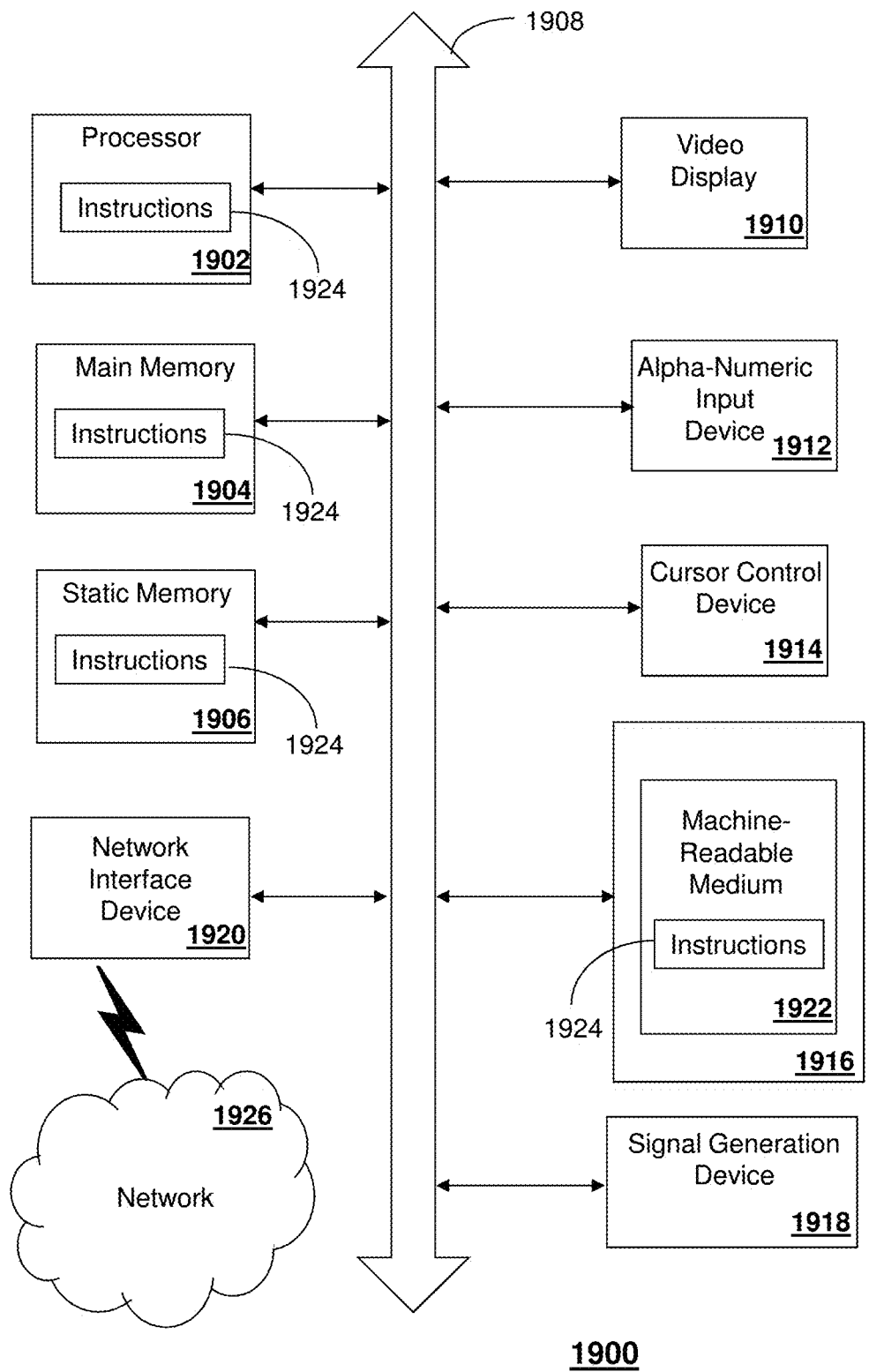
FIG. 19 depicts an illustrative diagrammatic representation of a machine in the form of a computer system within which a set of instructions, when executed, may cause the machine to perform any one or more of the methodologies disclosed herein.

FIG. 19 depicts an exemplary diagrammatic representation of a machine in the form of a computer system 1900 within which a set of instructions, when executed, may cause the machine to perform any one or more of the methods discussed above. One or more instances of the machine can operate, for example, as the communication device 100 of FIG. 1. For example, the computer system 1900 can serve at least in part as the controller 106 of FIG. 1. Thus, the computer system 1900 can at least in part perform the functions of controlling one or more of the tunable circuits 122, 150 (FIG. 1), 102 (FIG. 2), 202 (FIGS. 3 and 5), the bias and control module 1230, and the monitor module 1240 (FIG. 12). In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment.

The machine may comprise a server computer, a client user computer, a personal computer (PC), a tablet PC, a smart phone, a laptop computer, a desktop computer, a control system, a network router, switch or bridge, or any machine capable of executing a set of instructions (sequential or otherwise) that specify actions to be taken by that machine. It will be understood that a communication device of the subject disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methods discussed herein.

The computer system 1900 may include a processor (or controller) 1902 (e.g., a central processing unit (CPU), a graphics processing unit (GPU, or both), a main memory 1904 and a static memory 1906, which communicate with each other via a bus 1908. The computer system 1900 may further include a video display unit 1910 (e.g., a liquid crystal display (LCD), a flat panel, or a solid state display. The computer system 1900 may include an input device 1912 (e.g., a keyboard), a cursor control device 1914 (e.g., a mouse), a disk drive unit 1916, a signal generation device 1918 (e.g., a speaker or remote control) and a network interface device 1920.

The disk drive unit 1916 may include a tangible computer-readable storage medium 1922 on which is stored one or more sets of instructions (e.g., software 1924) embodying any one or more of the methods or functions described herein, including those methods illustrated above. The instructions 1924 may also reside, completely or at least partially, within the main memory 1904, the static memory 1906, and/or within the processor 1902 during execution thereof by the computer system 1900. The main memory 1904 and the processor 1902 also may constitute tangible computer-readable storage media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the subject disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

While the tangible computer-readable storage medium 1922 is shown in an example embodiment to be a single medium, the term "tangible computer-readable storage medium" should be taken to include a single medium or multiple media (e.g., a centralized or distributed database, and/or associated caches and servers) that store the one or more sets of instructions. The term "tangible computer-readable storage medium" shall also be taken to include any non-transitory medium that is capable of storing or encoding a set of instructions for execution by the machine and that cause the machine to perform any one or more of the methods of the subject disclosure.

The term "tangible computer-readable storage medium" shall accordingly be taken to include, but not be limited to: solid-state memories such as a memory card or other package that houses one or more read-only (non-volatile) memories, random access memories, or other re-writable (volatile) memories, a magneto-optical or optical medium such as a disk or tape, or other tangible media which can be used to store information. Accordingly, the disclosure is considered to include any one or more of a tangible computer-readable storage medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are from time-to-time superseded by faster or more efficient equivalents having essentially the same functions. Wireless standards for device detection (e.g., RFID), short-range communications (e.g., Bluetooth, WiFi, Zigbee), and long-range communications (e.g., WiMAX, GSM, CDMA, LTE) are contemplated for use by computer system 1900.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, are contemplated by the subject disclosure.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A multiband antenna comprising:
   a feed port;
   a first radiating portion coupled to the feed port and defining a first resonant bandwidth;
   a second radiating portion coupled to the feed port and defining a second resonant bandwidth differing from the first resonant bandwidth, the second radiating portion comprising:
   a proximal radiating segment extending axially between two ends, supported on a first substrate and coupled to the feed port;
   a distal radiating segment supported on a second substrate, wherein a portion of the first substrate at a first one of the two ends overlaps a portion of the second substrate to obtain overlapping portions of the proximal radiating segment and the distal radiating segment that define a first gap therebetween; and
   an adjustable tuning circuit coupled between the overlapping portions of the proximal radiating segment and the distal radiating segment, wherein adjustment of the adjustable tuning circuit modifies the second resonant bandwidth without altering the first resonant bandwidth,
   wherein the first radiating portion comprises:
   a proximal radiating segment extending axially between two ends, supported on the first substrate and coupled to the feed port;
   a distal radiating segment supported on the second substrate, wherein a portion of the first substrate at a first one of the two ends overlaps a portion of the second substrate to obtain overlapping portions of the proximal radiating segment and the distal radiating segment that define a second gap therebetween; and
   an adjustable tuning circuit coupled between the overlapping portions of the proximal radiating segment and the distal radiating segment, wherein adjustment of the tuning circuit modifies the first resonant bandwidth without altering the second resonant bandwidth.

2. The multiband antenna of claim 1, wherein the adjustable tuning circuit comprises a tunable phase shifter.

3. The multiband antenna of claim 2, wherein the tunable phase shifter comprises one of a variable reactance diode, a variable inductor, a variable capacitor, or a combination thereof.

4. The multiband antenna of claim 2, wherein the tunable phase shifter comprises a switchable network comprising a resistor, a capacitor, an inductor, or a combination thereof.

5. The multiband antenna of claim 1, wherein the adjustable tuning circuit comprises one of a first fixed reactive element controlled by a semiconductor device to produce a variable reactance, a second fixed reactive element controlled by a first micro-electro-mechanical systems device to produce the variable reactance, a first variable reactive element controlled by a second micro-electro-mechanical systems device to produce the variable reactance, a second variable reactive element controlled by a bias signal that varies a dielectric constant of the variable reactive element to produce the variable reactance, or a combination thereof.

6. The multiband antenna of claim 1, wherein the multiband antenna comprises a planar inverted F antenna.

7. The multiband antenna of claim 1, further comprising an adjustable tuning circuit coupled between the feed port and each of the first radiating portion and the second radiating portion.

8. A communications device comprising:
   one of a transmitter, a receiver, or both; and
   a multiband antenna comprising:
   a feed port;
   a plurality of radiating portions, comprising a first radiating portion of the plurality of radiating portions coupled to the feed port and defining a first respective resonant bandwidth and a second radiating portion of the plurality of radiating portions coupled to the feed port and defining a second respective resonant bandwidth;

a first tunable phase shifter coupled between a proximal radiating segment and a distal radiating segment of the first radiating portion of the plurality of radiating portions, wherein the proximal radiating segment is supported on a first substrate and the distal radiating segment is supported on a second substrate, wherein a portion of the first substrate partially overlaps a portion of the second substrate defining a gap between the proximal radiating segment and the distal radiating segment, and wherein adjustment of the first tunable phase shifter modifies the first respective resonant bandwidth, without altering the second respective resonant bandwidth of the second radiating portion of the plurality of radiating portions; and a second tunable phase shifter coupled between a proximal radiating segment and a distal radiating segment of the second radiating portion of the plurality of radiating portions, wherein the proximal radiating segment is supported on the first substrate and the distal radiating segment is supported on the second substrate, wherein a portion of the first substrate partially overlaps a portion of the second substrate defining a gap between the proximal radiating segment and the distal radiating segment, and wherein adjustment of the second tunable phase shifter modifies the second respective resonant bandwidth, without altering the first respective resonant bandwidth of the first radiating portion of the plurality of radiating portions.

9. The communications device of claim 8, further comprising a memory storing instructions and controller coupled to the memory and the tunable phase shifter, wherein the controller provides a respective tuning signal to the tunable phase shifter.

10. The communications device of claim 9, wherein the controller upon executing the instructions performs operations comprising determining the respective tuning signal based on an entry in a look-up table according to one of a desired frequency, a mode of operation of a communication device utilizing the multiband antenna, or a combination thereof.

11. The communications device of claim 10, wherein the controller upon executing the instructions performs operations comprising determining the respective tuning signal responsive to feedback obtained from the multiband antenna, wherein the feedback is indicative of performance of the respective resonant bandwidth with respect to a desired frequency.

12. The communications device of claim 8, wherein the tunable phase shifter comprises one of a variable reactance PIN diode, a variable inductor, a variable capacitor, or a combination thereof.

13. The communications device of claim 8, wherein the communications device is selected from a group of mobile communications devices consisting of cellular phones, smart phones, personal digital assistants, tablets, personal computers, navigation devices, remote controllers, game controllers, and combinations thereof.

* * * * *